United States Patent [19]

Yoshida et al.

[11] Patent Number: 5,606,182
[45] Date of Patent: Feb. 25, 1997

[54] OPTICAL SEMICONDUCTOR DEVICE FOR OPTICAL COMMUNICATIONS WITH INCREASED POSITIONAL ACCURACY OF AN OPTICAL ACCESS AND METHOD OF FABRICATING THE SAME

[75] Inventors: Masaharu Yoshida; Masataka Takehara, both of Fukuoka, Japan

[73] Assignee: Mitsubishi Denki Kabushiki Kaisha, Tokyo, Japan

[21] Appl. No.: 428,369

[22] Filed: Apr. 25, 1995

[30] Foreign Application Priority Data

Apr. 27, 1994 [JP] Japan ................................ 6-089512

[51] Int. Cl.⁶ ......................... H01L 33/00; H01L 27/14; H01L 31/0232; H01L 31/0203
[52] U.S. Cl. ........................ 257/99; 257/98; 257/431; 257/432; 257/433
[58] Field of Search ................ 257/98, 99, 431, 257/432, 433

[56] References Cited

U.S. PATENT DOCUMENTS 4,920,262  4/1990  Aiki et al. ................... 250/227.11
5,448,676  9/1995  White et al. ...................... 257/99

OTHER PUBLICATIONS

Gilleo et al., "Optical Coupling: New Approach to Micro Circuit Interconnections", Opto Electronics Devices & Circuits, pp. 249–253, 1964.

*Primary Examiner*—Mahshid D. Saadat
*Assistant Examiner*—Valencia Martin Wallace
*Attorney, Agent, or Firm*—Oblon, Spivak, McClelland, Maier & Neustadt, P.C.

[57] ABSTRACT

In order to position an optical semiconductor element in high accuracy and to readily fabricate the same, step is formed on an upper surface of a forward end of an electrode (123) projecting from a lead frame. A submount (102) is previously soldered to a lower stage surface (125), while solder (172) is applied to its upper surface. A collet (61) which is softly supported by a spring (63) in the vertical direction suctionally holds a laser diode element (101) and approaches the electrode (123) from above, to be stopped when its leg portion (61b) comes into contact with an upper stage surface (126). Thus, the laser diode element (101) is precisely positioned. In this state, the solder (172) is heated and cooled, to solder the laser diode element (101) to the submount (102). The laser diode element (101) molded with transparent resin, to be easy to fabricate.

16 Claims, 24 Drawing Sheets

F I G . 12B
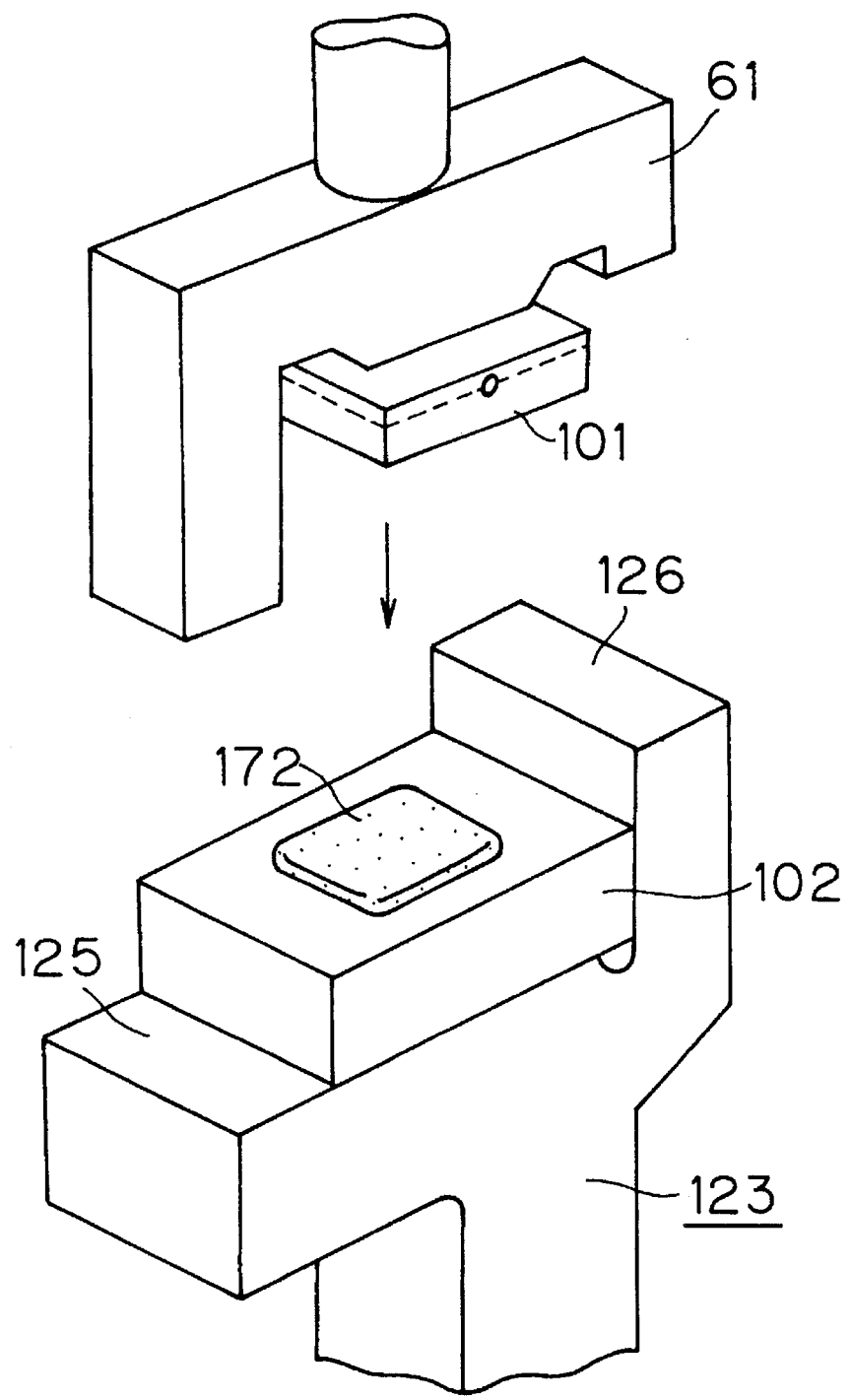

F I G. 22
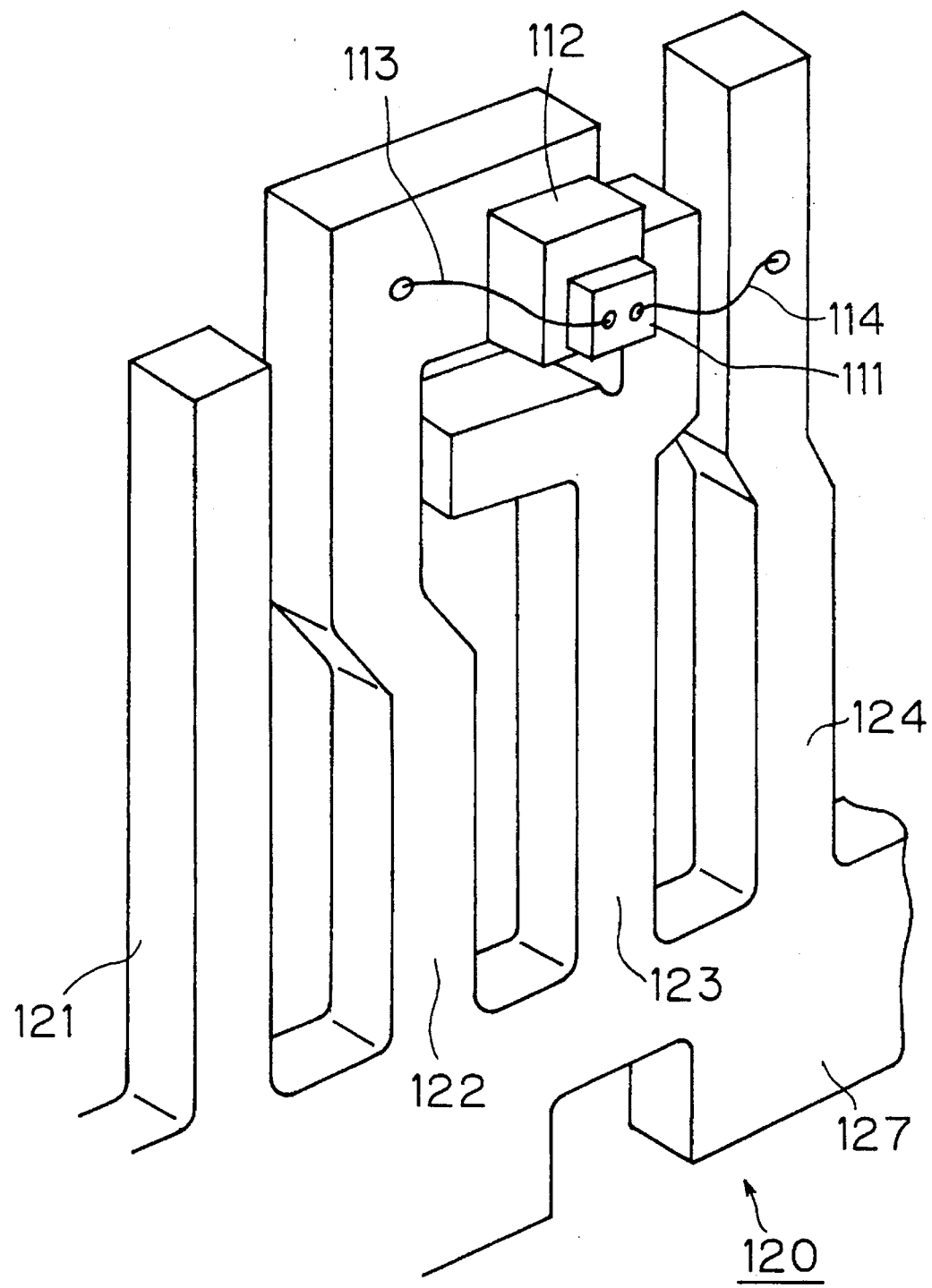

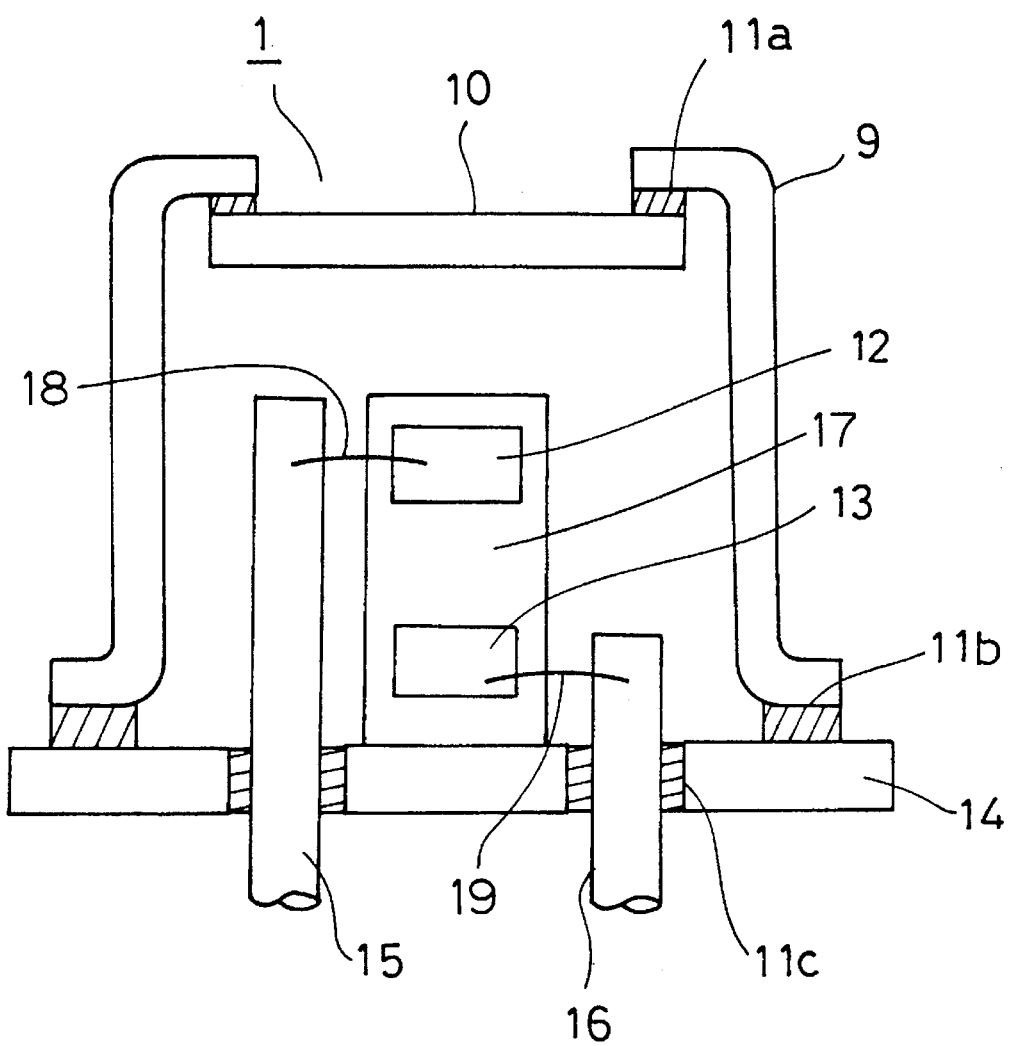

OPTICAL SEMICONDUCTOR DEVICE FOR OPTICAL COMMUNICATIONS WITH INCREASED POSITIONAL ACCURACY OF AN OPTICAL ACCESS AND METHOD OF FABRICATING THE SAME

BACKGROUND OF THE INVENTION

1. Field of the Invention

The present invention relates to an optical semiconductor device such as a laser diode unit, a laser photoreceptor unit or an optical communication module and a method of fabricating the same, and more particularly, it relates to improvements for increasing positional accuracy of an optical axis and simplifying the fabrication.

2. Background of the Invention

FIG. 24 is a front sectional view showing a conventional laser diode unit 1. In this laser diode unit 1, a laser diode element 12 and a photoreceptor 13 are fixed to a side surface of a conductor block 17 which is fixed onto a conductor substrate 14. The laser diode element 12 and the photoreceptor 13 are stored in a cap 9 which is fixed onto the substrate 14. A window which is covered with a transparent cover glass member 10 is provided on an upper surface of the cap 9, so that a laser beam emitted from the laser diode element 12 is transmitted to the exterior through this window.

Further, the laser diode element 12 and the photoreceptor 13 are electrically connected to the substrate 14 through the block 14, while the same are electrically connected to electrodes 15 and 16 which are fixed to the substrate 14 through insulators 11c, by conductor wires 18 and 19 respectively. A current is externally supplied through the substrate 14 and the electrode 15, so that the laser diode element 12 emits a laser beam. This laser beam is monitored by the photoreceptor 13. Namely, the photoreceptor 13 generates an output current in response to the intensity of the laser beam, so that this output current is taken out to the exterior through the substrate 14 and the electrode 16.

The laser beam which passes through the cover glass member 10 to be radiated to the exterior is guided through a prescribed optical path which is provided in the exterior, and employed for reading or writing information from or in an optical disk, for example. Alternatively, the laser beam is guided to an optical fiber member for communication, to be employed for transmitting information.

An external control unit (not shown) is connected to the substrate 14 and the electrodes 15 and 16, for supplying the current to the laser diode element 12. The output current of the photoreceptor 13 is so monitored that the value of the current which is supplied to the laser diode element 12 is adjusted to maintain light emission intensity of the laser diode element 12 at a constant level. Still another electrode (not shown) is connected to the substrate 14, so that the external control unit is electrically coupled with the substrate 14 through this electrode.

The cap 9 is adapted to protect the elements which are stored in its interior. Further, hermetic seals 11a, 11b and 11c are provided on joints between respective members defining the container storing these elements, thereby airtightly maintaining the container. Further, inert gas such as argon gas or nitrogen gas is injected into the container. Thus, the elements are placed in an inert gas atmosphere which is sealed against the exterior, so that the laser diode element 12 which is particularly weak against adhesion of a conductive substance such as moisture is protected.

In the conventional laser diode unit 1, as hereinabove described, the hermetic seals 11a, 11b and 11c are provided on three portions including a portion for taking out the optical output, a final sealing part and a portion for taking out the electrodes. In the first place, therefore, the fabrication steps are complicated and hence the fabrication cost is increased. In addition, it is difficult to locate the laser diode element 12 on a prescribed position, in the second place.

SUMMARY OF THE INVENTION

According to a first aspect of the present invention, an optical semiconductor device comprises (a) an optical semiconductor unit, including (a-1) an optical semiconductor element, (a-2) a light transmittable sealing body sealing the optical semiconductor element, and (a-3) an electrode having an end which is electrically connected to the optical semiconductor element and another end projecting from the sealing body, (b) a receptacle which is capable of mounting an optical fiber cable and attachable to/detachable from the optical semiconductor unit, for relaying optical coupling between the optical semiconductor unit and the optical fiber cable, (c) a socket which is engageable with the electrode, and (d) a support which is capable of fixedly supporting the optical semiconductor unit and fixedly coupled with the socket.

In the optical semiconductor unit which is provided in the optical semiconductor device according to the first aspect the present invention, the optical semiconductor element is sealed with the light transmittable sealing body, whereby a protective function such as moisture resistance of the optical semiconductor element etc. is implemented by simple fabrication steps. Further, the optical semiconductor unit is fixedly supported by the support which is coupled with the socket, whereby no useless force acts on the electrode when the receptacle is attached/detached. Thus, the electrode is neither broken nor deformed by attachment/detachment of the receptacle.

According to a second aspect of the present invention, the sealing body and the receptacle are provided with members forming a set of tapered projection and depression which are engageable with each other respectively.

In the optical semiconductor device according to the second aspect of the present invention, the tapered projection and depression which are provided on the sealing body of the optical semiconductor unit and the receptacle respectively are engaged with each other, whereby the optical axis of the optical semiconductor unit and the optical fiber member which is mounted on the receptacle are accurately and simply positioned with each other.

According to a third aspect of the present invention, a method of fabricating an optical semiconductor device comprises (a) a step of preparing an optical semiconductor element, (b) a step of preparing a holder capable of holding the optical semiconductor element, (c) a step of preparing a electrically conductive lead frame having a band plate shaped lead frame body and a columnar electrode projecting from a cross-directional end surface of the lead frame body and being provided on its forward end portion with a flat element mounting surface and a-flat reference surface, (d) a step of preparing a mold for sealing, (e) a step of bringing an end surface of the holder into contact with the reference surface while holding the optical semiconductor element by the holder, thereby locating the optical semiconductor element on a prescribed position on the element mounting surface, (f) a step of fixedly supporting the optical semiconductor element on the element mounting surface through a fixing medium while locating the same on the prescribed position, (g) a step of mounting the lead frame which is fixed with the optical semiconductor element on the mold, (h) a step of injecting a light transmittable sealing body into the mold after the step (g), thereby sealing the optical semiconductor element with the sealing body, and (i) a step of separating the electrode from the lead frame body after the step (h).

In the method according to the third aspect of the present invention, the optical semiconductor element is sealed with the light transmittable sealing body, whereby an optical semiconductor device having a protective function such as moisture resistance of the optical semiconductor element is obtained through simple fabrication steps. Further, both of the element mounting surface fixedly supporting the optical semiconductor element and the reference surface serving as the reference for positioning of the optical semiconductor element are formed on the forward end portion of the electrode. Namely, the element mounting surface and the reference surface are provided in proximity to each other. Therefore, the optical semiconductor element influencing on the position of the optical axis is accurately positioned.

According to a fourth aspect of the present invention, the step (c) comprises (c-1) a step of providing a step between the element mounting surface and the reference surface so that the reference surface and the element mounting surface are parallel to each other with the reference surface serving as an upper stage surface.

In the method according to the fourth aspect of the present invention, a step is provided between the element mounting surface and the reference surface which are provided on the forward end portion of the electrode so that the reference surface defines an upper stage surface, whereby a brazing material such as solder or a fixing medium such as an adhesive is not fluidized to contaminate the reference surface when the optical semiconductor element is fixedly supported on the element mounting surface. Namely, it is possible to prevent the optical semiconductor element from deterioration in positioning accuracy which may be caused by contamination of the fixing medium.

According to a fifth aspect of the present invention, the step (c) comprises (c-2) a step of forming the element mounting surface and the reference surface as different regions on the same plane, with a groove which is defined therebetween.

In the method according to the fifth aspect of the present invention, the element mounting surface and the reference surface which are provided on the forward end surface of the electrode are formed to be flush with each other, whereby the step of preparing the lead frame is simplified. Further, the groove is defined between the element mounting surface and the reference surface, whereby a brazing material such as solder or a fixing medium such as an adhesive is not fluidized to contaminate the reference surface when the optical semiconductor element is fixedly supported on the element mounting surface. Namely, it is possible to prevent the optical semiconductor element from deterioration in positioning accuracy which may be caused by contamination of the fixing medium.

According to a sixth aspect of the present invention, the lead frame body has an end surface which is perpendicular to its longitudinal direction in the lead frame prepared in the step (c), and the step (d) comprises (d-1) a step of providing a first stop portion for being brought into contact with the cross-directional end surface of the lead frame body thereby deciding a cross-directional position of the lead frame with respect to the mold, integrally with the mold, and (d-2) a step of providing a second stop portion for being brought into contact with the end surface of the lead frame body which is perpendicular to its longitudinal direction thereby deciding a longitudinal position of the lead frame with respect to the mold, integrally with the mold, while the step (g) comprises (g-1) a step of bringing the end surface of the lead frame body which is perpendicular to its longitudinal direction into contact with the first stop portion with pressing force, and (g-2) a step of bringing the cross-directional end surface of the lead frame body into contact with the second stop portion with pressing force.

In the method according to the sixth aspect of the present invention, the lead frame body has the end surface which is perpendicular to its longitudinal direction, so that it is possible to position the lead frame with respect to the mold by bringing this end surface and the cross-directional end surface into contact with first and second stop portions which are provided on the mold respectively. Thus, sealing with the sealing body is accurately carried out on the prescribed position with respect to the lead frame, whereby positional relation between the optical axis which is defined by the optical semiconductor element and the sealing body is decided in high accuracy.

According to a seventh aspect of the present invention, the step (c) comprises (c-4) a step of preparing a electrically conductive plate member, (c-5) a step of punching the plate member while leaving drafts on the reference surface, the element mounting surface and the end surfaces to be in contact with the first and second stop portions, thereby forming the contour of the lead frame, and (c-6) a step of precisely working the drafts, thereby forming the reference surface, and the end surfaces to be in contact with the first and second stop portions.

In the method according to the seventh aspect of the present invention, the reference surface defining positional accuracy for the optical semiconductor element and the end surfaces which are in contact with the first and second stop positions defining positional accuracy of the sealing body are formed by precise working. Therefore, both of the optical semiconductor element and the sealing body are positioned in higher accuracy. Thus, the positional relation between the optical axis which is defined by the optical semiconductor element and the sealing 10 body is decided in higher accuracy.

According to an eighth aspect of the present invention, the step (a) comprises (a-1) a step of forming an indicator pattern having prescribed positional relation with respect to the optical axis of the optical semiconductor element on a surface of the optical semiconductor element to be fixed to the element mounting surface, and the step (e) comprises (e-1) a step of correcting the position and direction of the optical semiconductor element in the element mounting surface by referring to the indicator pattern while holding the optical semiconductor element with the holder.

In the method according to the eighth aspect of the present invention, the position and direction of the optical semiconductor element in the element mounting surface are corrected with reference to the indicator pattern, whereby the position and direction of the optical semiconductor element in the element mounting surface are decided in high accuracy. Thus, accuracy of the optical axis is further improved in the optical semiconductor device.

According to a ninth aspect of the present invention, the optical semiconductor element is a laser diode element, and the holder suctionally holds a surface of the laser diode element, other than that exposing a junction thereof, which is closest to an opening portion outputting a laser beam.

In the method according to the ninth aspect of the present invention, the holder suctionally holds the surface of the laser diode element which is closest to the opening in the surface not exposing the junction, whereby the optical axis is further accurately positioned.

Accordingly, an object of the present invention is to provide a method which can readily fabricate an optical semiconductor device as well as highly accurately position an optical semiconductor element.

Another object of the present invention is to obtain an optical semiconductor device which is hard to break and easy to handle.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 12A and 12B illustrate a step of the fabrication method according to the first preferred embodiment of the present invention;

FIG. 22 illustrates a step of a fabrication method according to a fourth preferred embodiment of the present invention;

FIG. 24 is a front sectional view showing a conventional laser diode unit.

DESCRIPTION OF THE PREFERRED EMBODIMENTS

<1. First Preferred Embodiment>

A first preferred embodiment of the present invention is now described.

<1-1. Structure and Operation of Device>

Figure 1:
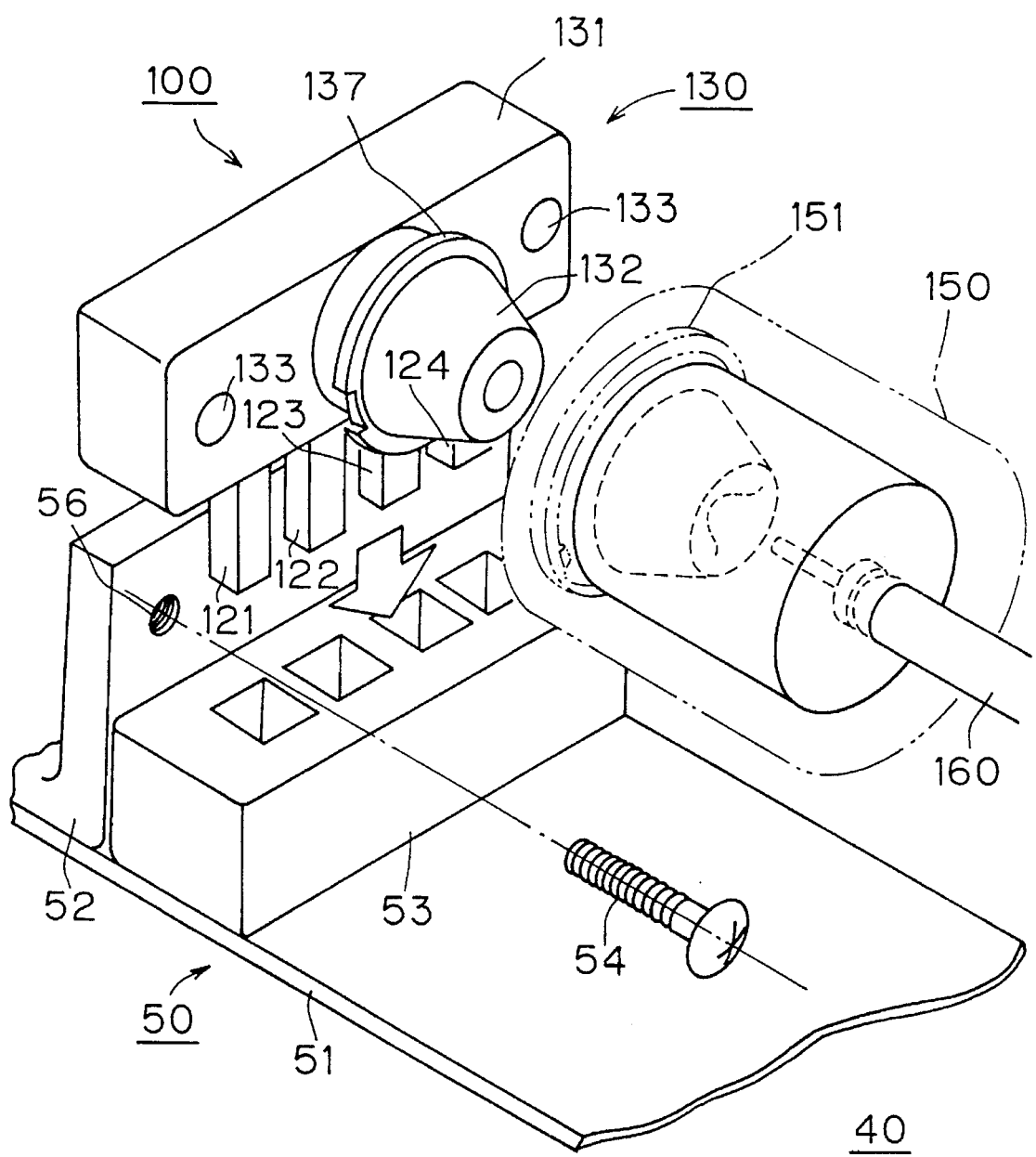
FIG. 1 is a perspective view showing an optical transmission module according to a first preferred embodiment of the present invention.

FIG. 1 is a general perspective view showing an optical semiconductor device according to this preferred embodiment. This device is an optical transmission module 40 in which a laser diode unit is integrated. This optical transmission module 40 comprises a laser diode unit 100 outputting a laser beam, a receptacle 150 serving as a relay for coupling an optical fiber cable 160 with the laser diode unit 100, and a support member 50 supporting the laser diode unit 100. In the support member 50, a socket 53 and a support plate 52 are mounted on a substrate 51. The support plate 52 is provided with screw holes 56 for fastening the laser diode unit 100.

In the laser diode unit 100, internal elements are sealed with a transparent resin molding 130. The resin molding 130 has a block part 131 and a tapered projection 132 which are integrally molded with each other. The projection 132 is engaged with a depression which is provided on an end surface of the receptacle 150, thereby implementing optical coupling between the laser diode unit 100 and the optical fiber cable 160.

A flange-shaped projection 137 which is partially provided with a recess is integrally formed on the projection 132. On the other hand, an annular stop member 151 which is partially provided with an inward projection is provided along the inner periphery of the receptacle 150. The flange-shaped projection 137 is engaged with the stop member 15, so that the receptacle 150 is fixed to the projection 132. In other words, the receptacle 150 is attachable to/detachable from the laser diode unit 100.

Four electrodes 121 to 124 project from the bottom surface of the block part 131, to be inserted in the socket 53. Thus, electric coupling between the laser diode unit 100 and an external unit (not shown) is implemented. Further, the block part 131 is provided with through holes 133 in positions corresponding to the screw holes 56. The laser diode unit 100 is fastened to the support plate 52 by screws 54 passing through the through holes 133 to be fitted with the screw holes 56.

Figure 2:
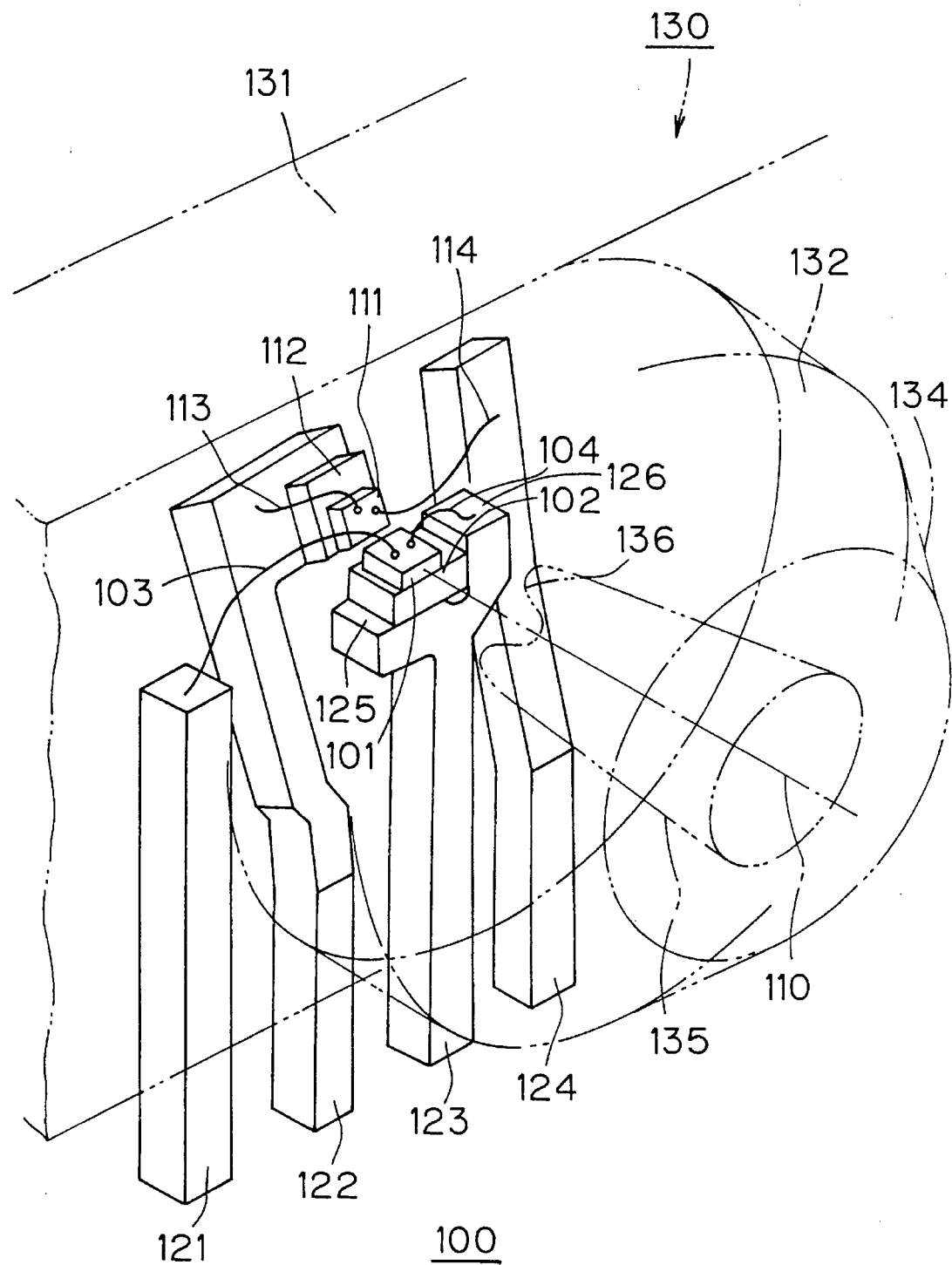
FIG. 2 illustrates a laser diode unit provided in the first preferred embodiment of the present invention in a perspective manner.

FIG. 2 is a perspective view showing the internal structure of the laser diode unit 100. In this laser diode unit 100, a laser diode element 101 which is an optical semiconductor element is mounted on an upper surface of a forward end portion of an upright electrode 123 through a submount 102. The forward end portion of the electrode 123 is so stepped that the submount 102 is fixedly provided on a lower stage surface 125. On the other hand, an upper stage surface 126 serves as a reference surface for positioning the laser diode element 101, as described later. When the laser diode element 101 is accurately set on a prescribed position, a laser beam which is frontwardly emitted from the laser diode element 101 progresses along a prescribed optical axis 110.

An upper portion of an electrode 122 is bent toward a portion behind the laser diode element 101, so that a photodiode 111, which is a photoreceptor serving as another optical semiconductor element, is mounted on a side surface of its forward end portion opposite to the laser diode element 101 through a submount 112. The photodiode 111 receives a laser beam which is rearwardly emitted from the laser diode element 101, thereby monitoring the intensity of the laser beam.

Due to the bending of the electrode 122, a light receiving surface of the photodiode 111 obliquely receives the laser beam which is emitted from the laser diode element 111. Therefore, the laser beam is prevented from positive reflection by the photodiode 111. Due to the bending of the electrode 122, further, the upper surface of the forward end portion of the electrode 123 is not covered with the forward end portion of the electrode 122, whereby the laser diode element 101 etc. can advantageously be readily mounted on the upper surface of the forward end portion of the electrode 123.

The laser diode element 101 is electrically connected with an electrode 121, which is upright similarly to the electrode 123, through a wire 103, while the same is also electrically connected with the electrode 123 through another wire 104. On the other hand, the photodiode 111 is electrically connected with an electrode 124 which is bent similarly to the electrode 122, while the same is also electrically connected with the electrode 121 through another wire 113.

Namely, the laser diode element 101 is supplied with a current from the external unit through the electrodes 122 and 123, to emit the laser beam as the result. A monitoring current which is outputted from the photodiode 111 is taken out to the external unit through the electrodes 121 and 124. The external unit monitors light emission intensity of the laser diode element 101 through the monitoring current, thereby controlling the current to be supplied to the laser diode element 101 for maintaining the light emission intensity at a prescribed level.

The laser diode element 101, the photodiode 111 and the wires 103, 104, 113 and 114 are sealed with the resin molding 130, to be protected against external moisture etc. A tapered side surface 134 which is rotation-symmetrical about the optical axis 110 is formed on the outer periphery of the projection 132. Further, a tapered depression 135 which is rotation-symmetrical about the optical axis 110 is formed in the central portion of the projection 132.

The receptacle 150 is engaged with the tapered side surface 134 and the tapered depression 135 to be coupled with the laser diode unit 100 so that relative positions thereof are univocally decided, whereby the central axis of the optical fiber cable 160 is accurately aligned with the optical axis 110 of the laser diode unit 100. Further, a projecting lens 136 is formed on the bottom portion of the tapered depression 135. This lens 136 condenses the laser beam which is emitted from the laser diode element 101 to be along the optical axis 110.

In the optical transmission module 40, as hereinabove described, the receptacle 150 is so engaged with the projection 132 that the relative positions of the receptacle 150 and the laser diode unit 100 are univocally decided, whereby the central axis of the optical fiber cable 160 can be correctly and readily aligned with the optical axis of the laser diode unit 100. Further, the laser diode unit 100 is fixed to the support member 50 through the support plate 52, whereby no to and detached from the laser diode unit 100, to cause neither breakage nor deformation of the electrodes 121 to 124.

<1-2. Method of Fabricating Unit>

Figure 3:
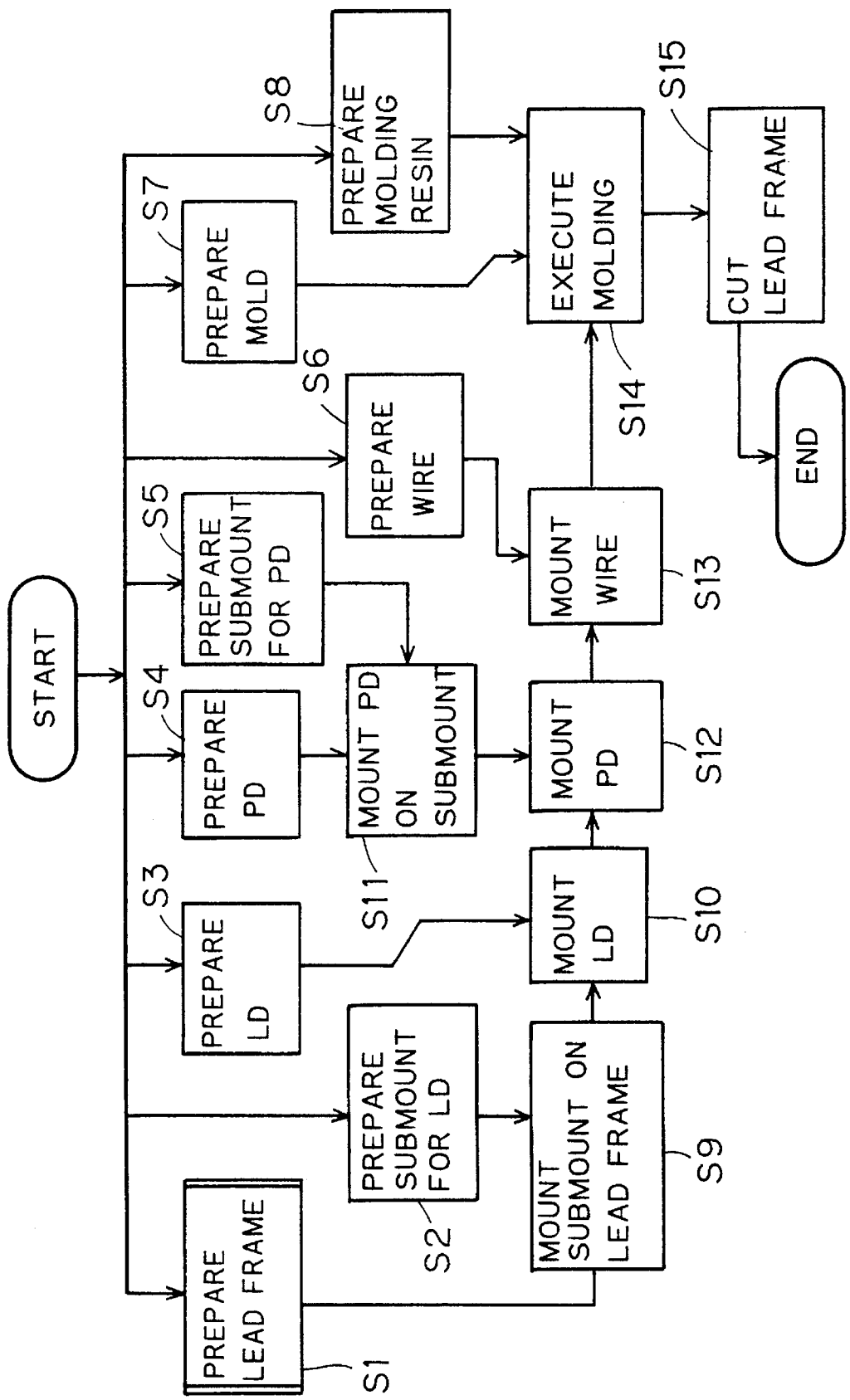
FIG. 3 is a flow chart showing a fabrication method according to the first preferred embodiment of the present invention.
Figure 4:
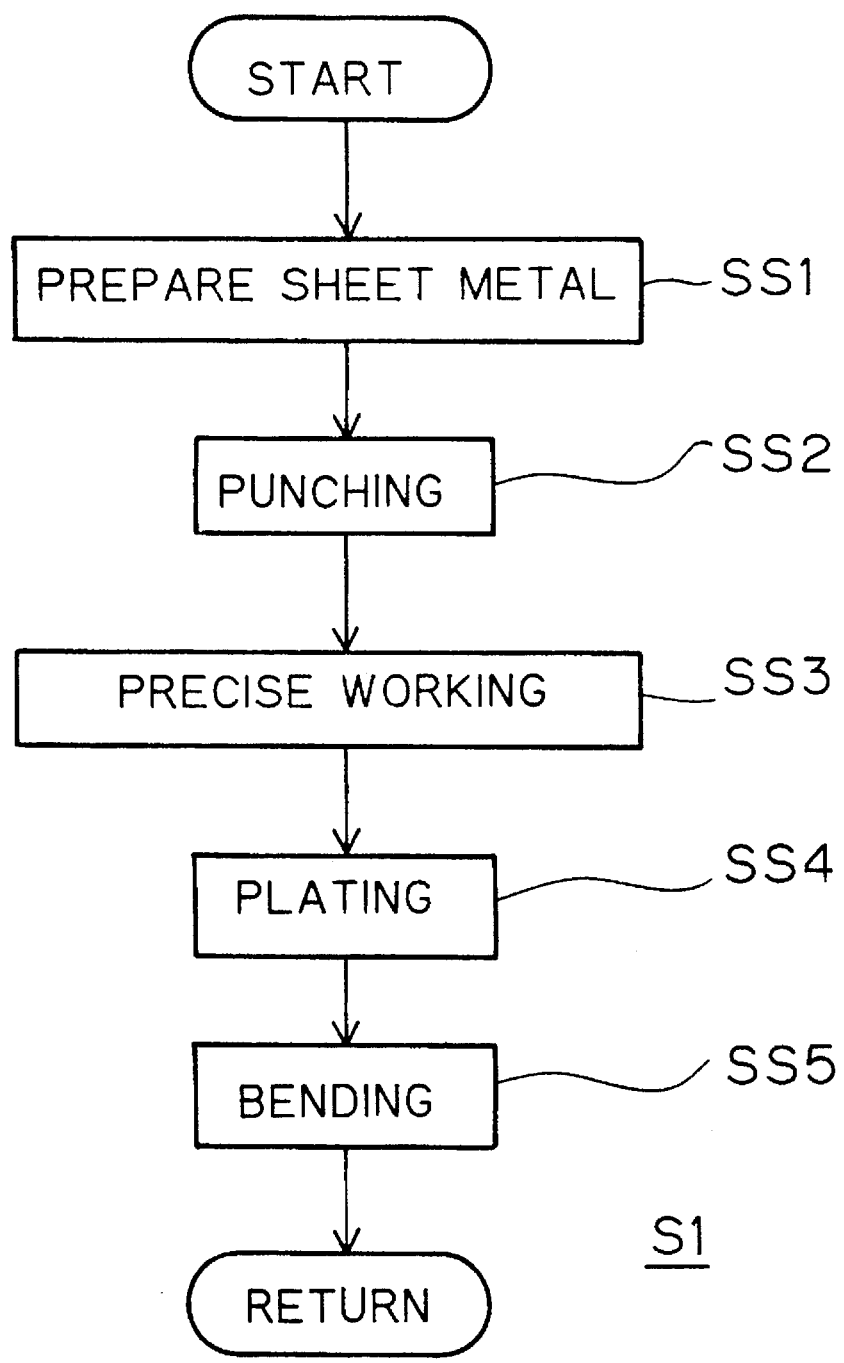
FIG. 4 is a flow chart showing the fabrication method according to the first preferred embodiment of the present invention.

A preferable method of fabricating the laser diode unit 100 is now described. FIG. 3 is a flow chart showing the flow of steps for fabricating the laser diode unit 100. FIG. 4 is a flow chart showing an internal flow of a step S1 shown in FIG. 3. With reference to these flow charts and process diagrams illustrating the respective steps, an exemplary method of fabricating the laser diode unit 100 is now described. A fabrication unit including a collet described later etc. is previously prepared in advance of the fabrication steps shown in FIG. 3.

<1-2-1. Step of Preparing Lead Frame>

As shown in FIG. 3, a lead frame is first prepared at the step S1 in this method. In this step, a sheet metal of copper, for example, serving as a principal material for the lead frame is prepared at a step SS1 as shown in FIG. 4. Then, this sheet metal is punched at a step SS2, to schematically form the contour of the lead frame 120. Then, precise working is executed at a step SS3, to precisely form the contour shape of the lead frame 120.

Figure 5:
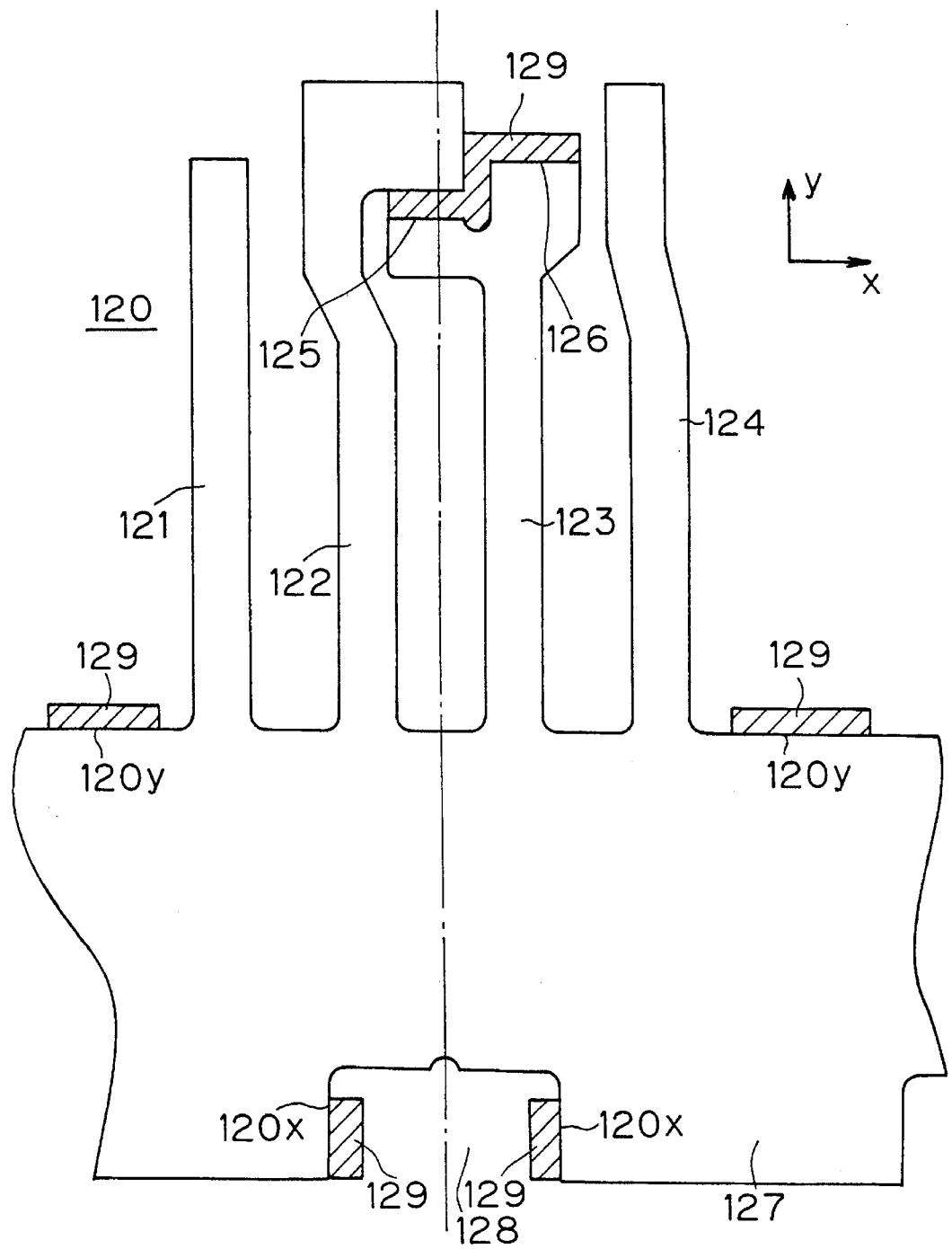
FIG. 5 illustrates a step of the fabrication method according to the first preferred embodiment of the present invention.
Figure 6:
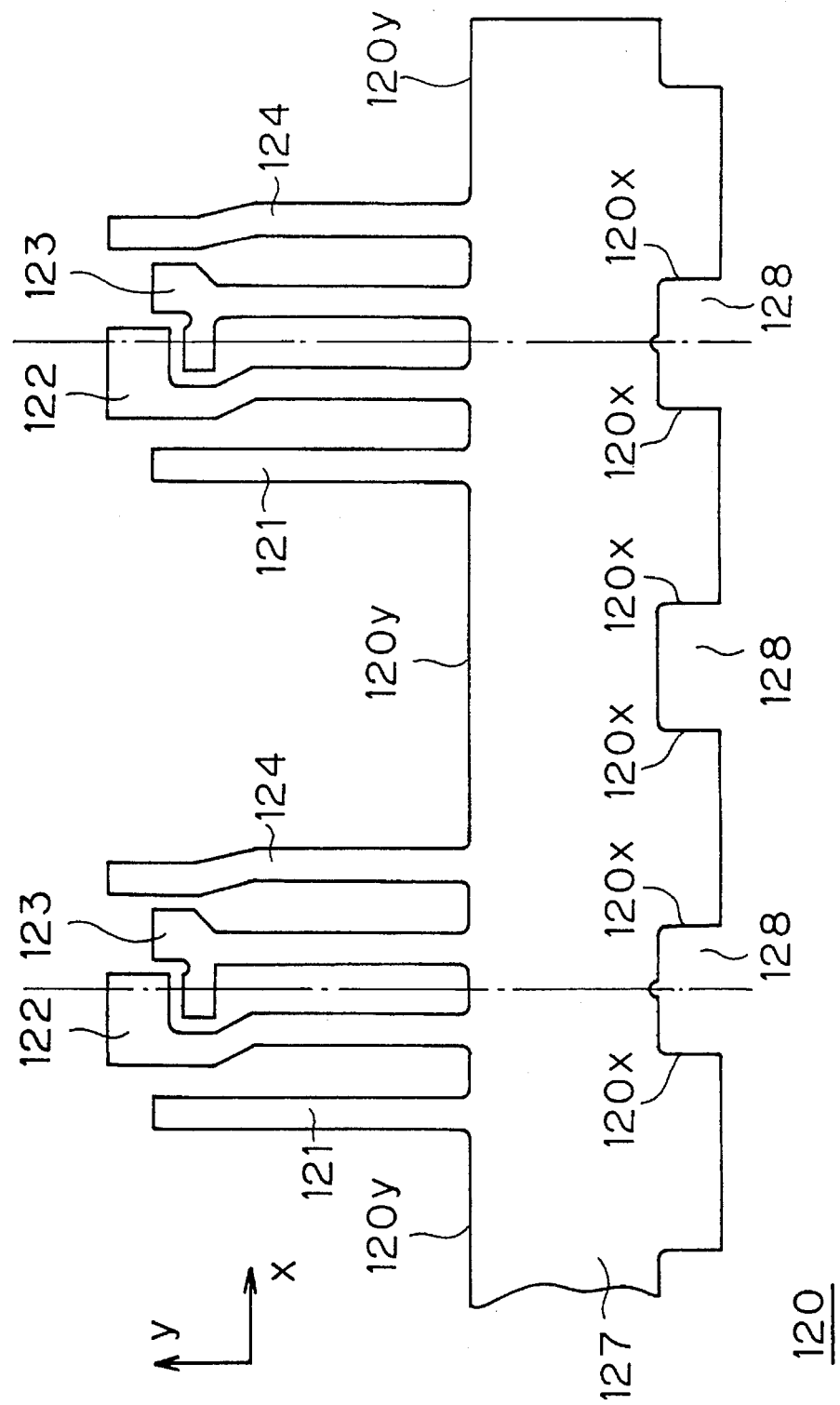
FIG. 6 illustrates a step of the fabrication method according to the first preferred embodiment of the present invention.

FIG. 5 is a partially enlarged front elevational view showing the contour shape of the lead frame 120 upon completion of the step SS2 in detail. As shown in FIG. 5, the punching is carried out to partially leave drafts 129 on the contour. The precise working at the following step SS3 is executed by cutting off the drabs 129 shown in FIG. 5 in high dimensional accuracy through wire electrodischarge, for example. FIG. 6 is a front elevational view showing the contour shape of the lead frame 120 upon completion of the precise working step.

As shown in FIGS. 5 and 6, sets of the four electrodes 121, 122, 123 and 124 repetitively vertically project from an upper surface, i.e., a cross-sectional end surface along a direction y, of a lead frame body 127 which is in the form of a transversely extending band plate at regular intervals, in the lead frame 120 as contoured.

Further, recesses 128 are repetitively formed on lower surface portions of the lead frame body 127 corresponding to those immediately under the sets of the electrodes 121, 122, 123 and 124 along the longitudinal direction of the lead frame body 127. Among end surfaces forming the contour of the lead frame body 127, portions 120y of the upper surface provided with no electrodes 121, 122, 123 and 124 and side surfaces 120x of the recesses 128 defining longitudinally perpendicular end surfaces function as reference surfaces with respect to a mold which is employed in a molding step as described later. The reference surfaces 120x and 120y define the position of the lead frame 120 with respect to the mold along the directions x and y respectively.

The forward end upper surface of the electrode 123 is stepped as described above, to be provided with lower and upper stage surfaces 125 and 126. Further, the laser diode element 101 etc. are mounted on the lower stage surface 125, as described above. In addition, the upper stage surface 126 functions as a reference surface for deciding the position of the laser diode element 101 before the same is mounted on the lower stage surface 125, as described later. 10 Therefore, the drafts 129 are left on the reference surfaces 120x and 120y and the lower and upper stage surfaces 125 and 126 in the punching step, and precisely cut off in the following precise working step. Consequently, dimensional accuracy within ±2 μm is implemented with respect to the reference surfaces 120x and 120y and the lower and upper stage surfaces 125 and 126. This enables decision of the position of the optical axis 110 in accuracy within +5 μm, as described later.

Thus, only portions requiring high dimensional accuracy are selectively precisely worked in the contour of the lead frame 120, whereby high dimensional accuracy is implemented at a low cost. When the precise working is carried out by wire electrodischarge, a number of (e.g., about 50 to 100) lead frames 120 may be overlapped with each other to be simultaneously worked, so that the working efficiency is further improved.

Figure 7:
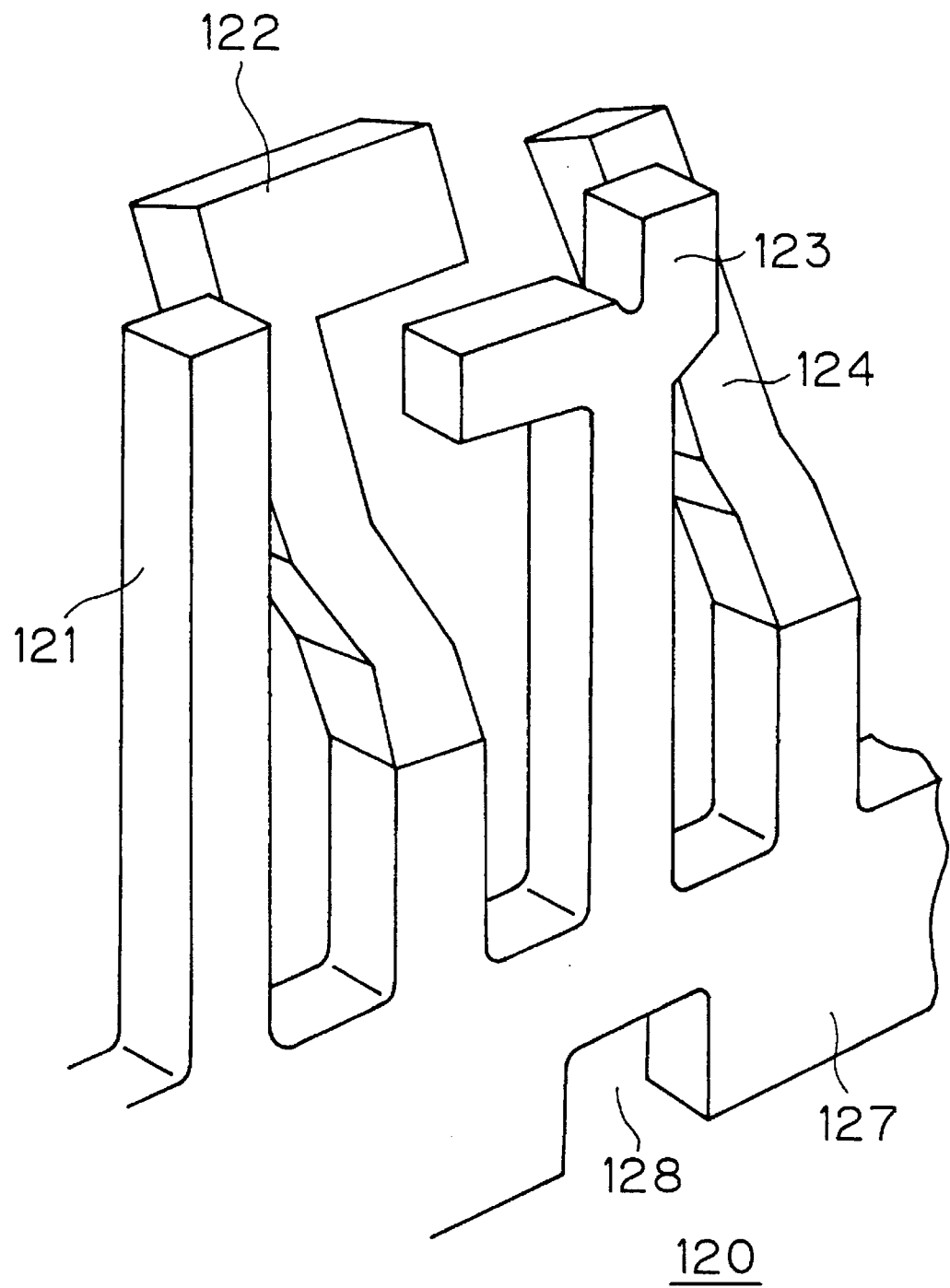
FIG. 7 illustrates a step of the fabrication method according to the first preferred embodiment of the present invention.

Upon completion of the precise working step, the process advances to a plating step SS4. In this step, the surface of each precisely worked lead frame 120 shown in FIG. 6 is plated. Thereafter the process advances to a bending step SS5. FIG. 7 is a partially fragmented perspective view showing the shape of the lead frame 120 after the bending step. As shown in FIG. 7, upper portions of the electrodes 122 and 124 are rearwardly bent through the bending step among the four electrodes 121, 122, 123 and 124. The electrodes 122 and 124 are bent at the same angle.

The steps SS4 and SS5 may be executed in reverse order. Preparation of the lead frame 120 is completed in the aforementioned manner.

<1-2-2. Step of Mounting Laser Diode Element>

A step S2 (FIG. 3) is carried out in parallel with the step S1. In this step, the submount 102 is prepared. As shown in FIG. 2, the submount 102, which is in the form of a rectangular parallelopiped block, is prepared from a material having a thermal expansion coefficient, which is close to that of the laser diode element 101, and high heat conductivity. For example, SiC or Si is selected as this material. The step of preparing the submount 102 is well known in the art and hence redundant description is omitted.

Figure 8:
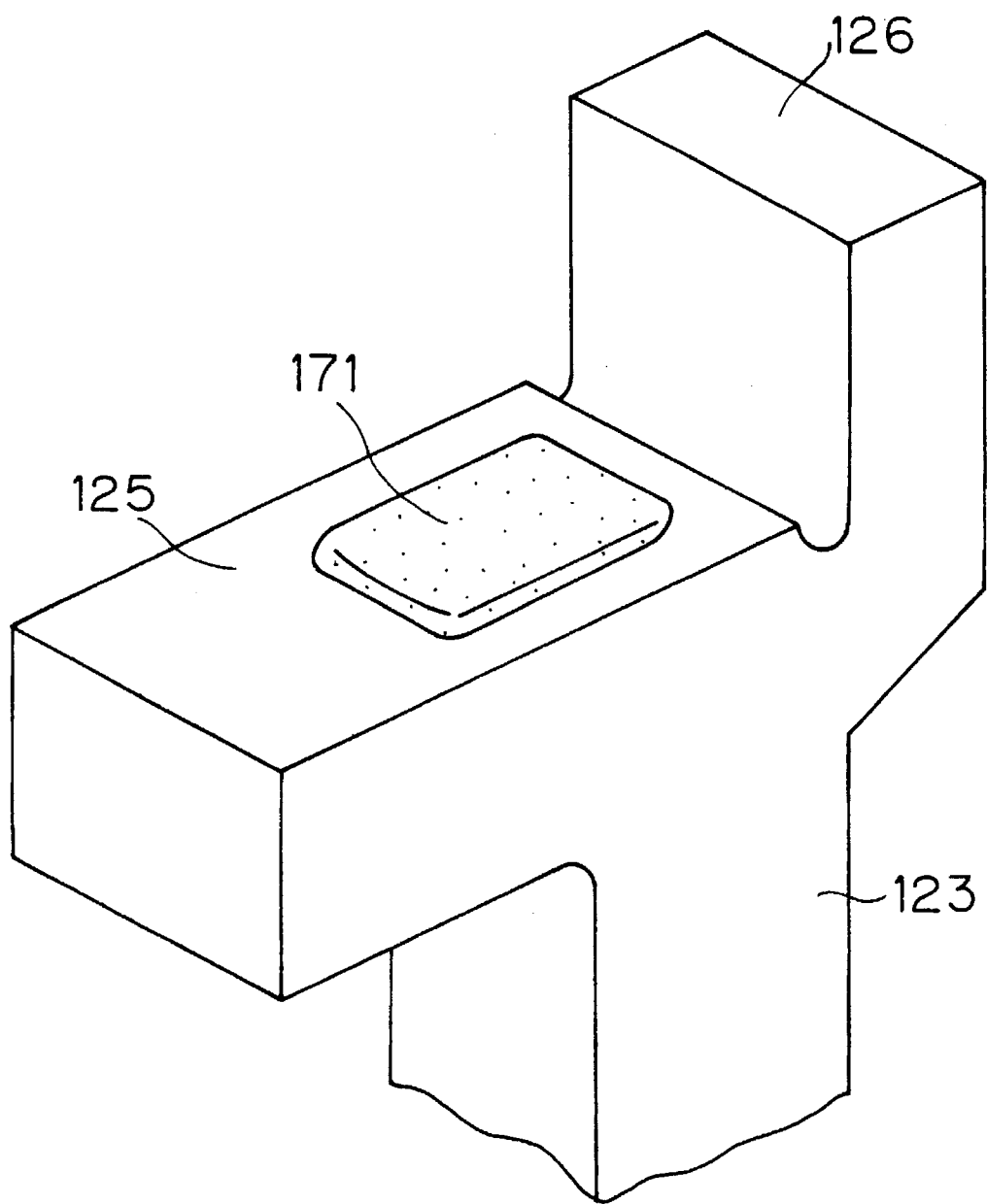
FIG. 8 illustrates a step of the fabrication method according to the first preferred embodiment of the present invention.
Figure 9:
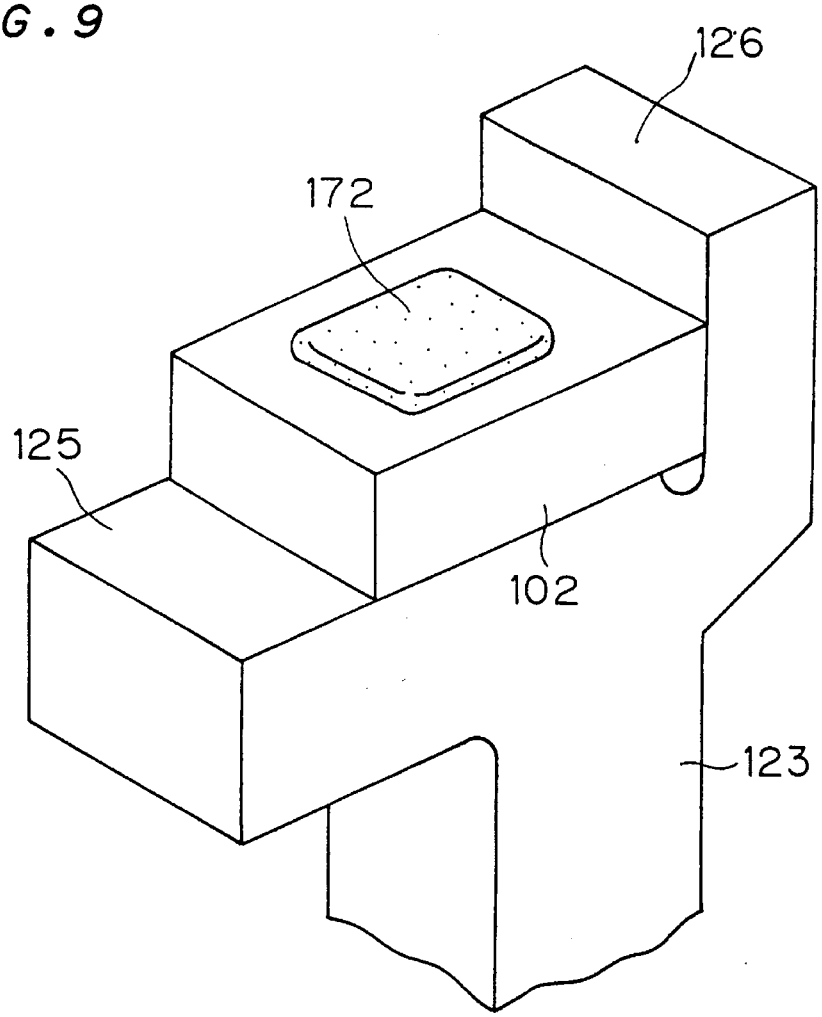
FIG. 9 illustrates a step of the fabrication method according to the first preferred embodiment of the present invention.

After completion of the steps S1 and S2, the process advances to a step S9 (FIG. 3). At this step S9, the submount 102 is mounted on the forward end portion of the electrode 123. FIGS. 8 and 9 illustrate this step. In order to mount the submount 102, solder 171 is first applied onto the lower stage surface 125 which is provided on the forward end portion of the electrode 123, as shown in FIG. 8. This solder 171 is prepared from an Au-Si solder material having a relatively high melting point of 376° C., for example.

Then, the submount 102 is placed on the solder 171 as shown in FIG. 9, temporarily heated to a temperature exceeding the melting point of 376° C., and thereafter cooled, so that the submount 102 is soldered to the lower stage surface 125. The heating is carried out by holding the lead frame 120 with heating blocks, for example. Thereafter another solder 172 is applied onto the upper surface of the submount 102. This solder 172 is prepared from an Au—Sn solder material having a relatively low melting point of 280° C., for example.

A step S3 (FIG. 3) is carried out in parallel with the step S9. At this step S3, the laser diode element 101 is prepared. The step of preparing the laser diode element 101 is well known in the art, and hence redundant description is omitted.

Figure 10:
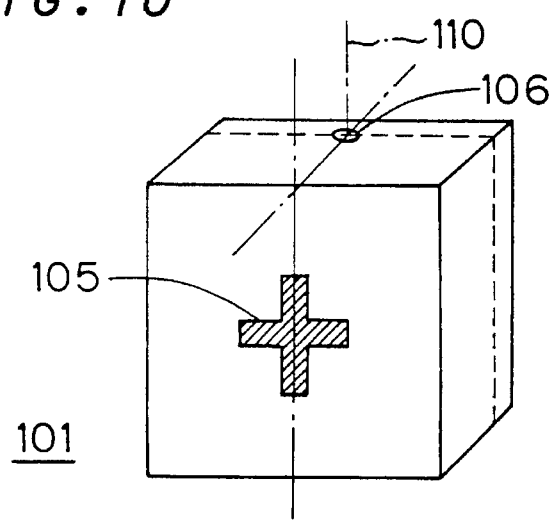
FIG. 10 illustrates a step of the fabrication method according to the first preferred embodiment of the present invention.
Figure 11:
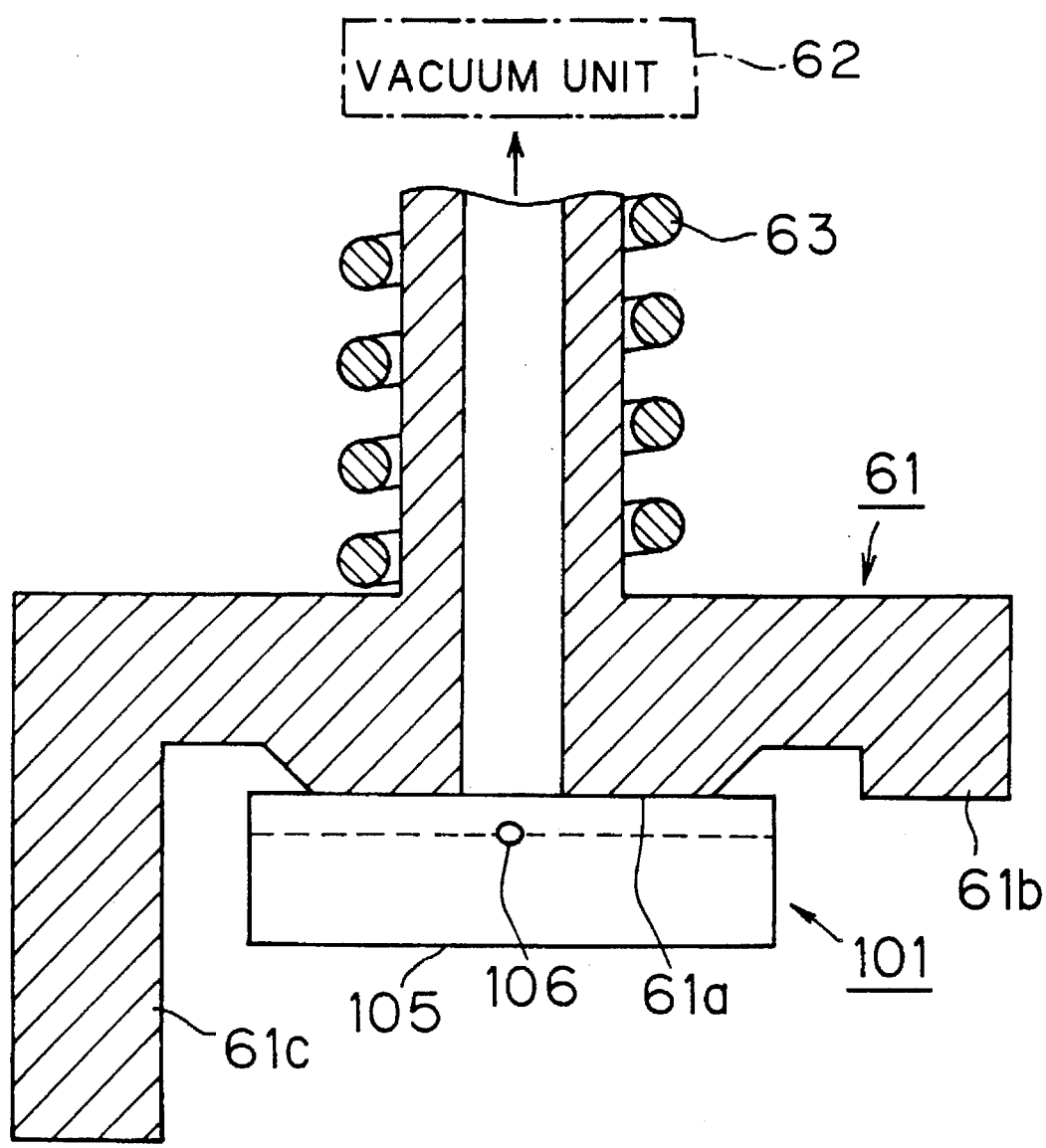
FIG. 11 illustrates a step of the fabrication method according to the first preferred embodiment of the present invention.

After completion of the steps S9 and S3, the process advances to a step S10 (FIG. 3). At the step S10, the laser diode element 101 is mounted on the submount 102. FIGS. 10 to 14 illustrate this step. In order to mount the laser diode element 101, an indicator pattern 105 is first formed on the bottom surface of the laser diode element 101, i.e., the surface which is soldered to the submount 102, as shown in FIG. 10.

This indicator pattern 105 is prepared in the form of a cross as shown in FIG. 10, for example, and capable of indicating the central position of the bottom surface of the laser diode element 101 and the direction of the optical axis 110. The indicator pattern 105 is formed in dimensional accuracy within +1 μm with respect to the optical axis 110, by a method such as that of selectively etching the bottom surface of the laser diode 101 by photolithography, for example.

The laser diode element 101 is mounted on the electrode 123 in the so-called junction-up manner. Namely, the bottom surface of the laser diode element 101, i.e., the soldered surface, is defined by that of two surfaces other than those exposing a junction part (shown by a dotted line in FIG. 10), which is separated from the opening portion 106 provided in a part of the junction part, emitting the laser beam, as shown in FIG. 10.

Then, the laser diode element 101 which is completely provided with the indicator pattern 105 is suctionally held by a collet 61 forming a part of the fabrication unit. The collect 61 is provided in the central portion of its bottom surface with a through hole communicating with a vacuum unit 62. Thus, the collet 61 suctionally holds the upper surface of the laser diode element 101, i.e., the surface which is opposite to the bottom surface, thereby holding the laser diode element 101 while bringing the same into contact with a holding surface 61a.

A spring 63 follows the collet 61, so that the collet 61 is vertically expandable/contractible to some extent due to elasticity of the spring 63. Namely, the collet 61 is flexibly supported along the vertical direction. Further, the collet 61 has leg portions 61b and 61c on both sides of the surface which is in contact with the laser diode element 101. In correspondence to the step provided on the forward end portion of the electrode 123, the leg portion 61b has a small length while the other leg portion 61c has a large length.

Figure 12A:
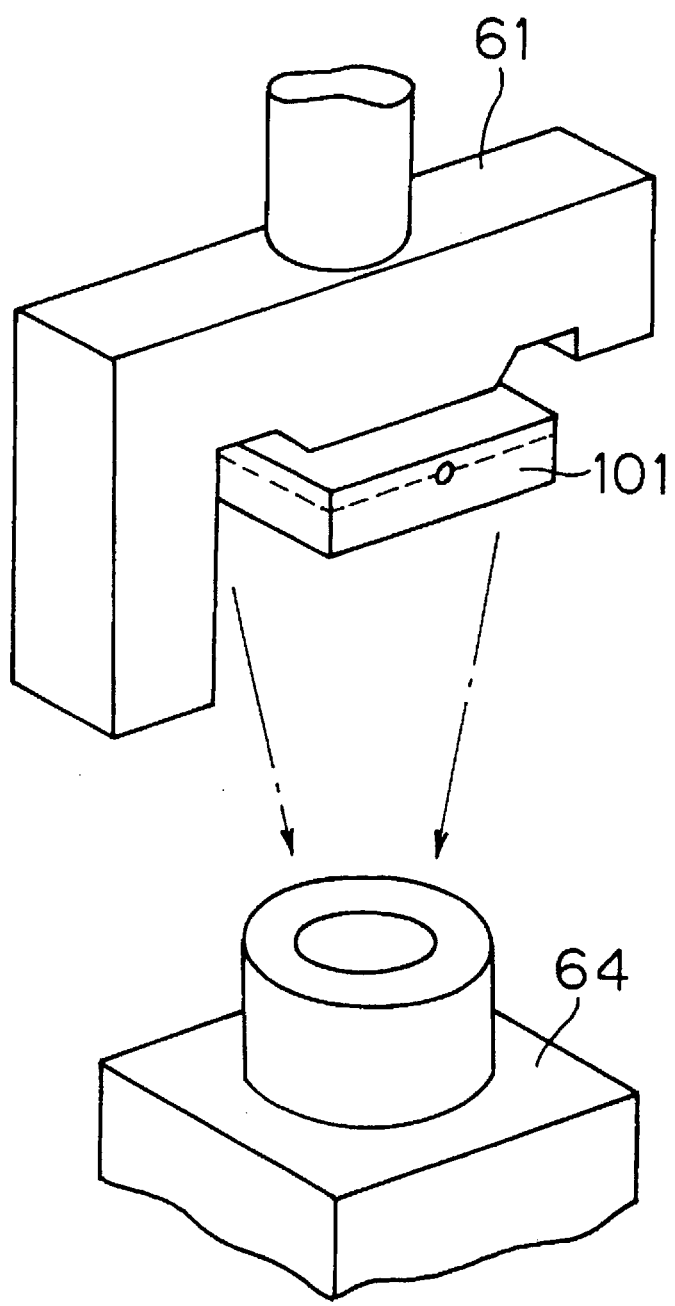

As shown in FIG. 12A, the collet 61 is moved to a position above an optical camera 64 while holding the laser diode element 101. At this time, the optical camera 64 picks up an image of the indicator pattern 105 which is provided on the bottom surface of the laser diode element 101. The optical camera 64 is coupled with a control unit (not shown), so that the image of the indicator pattern 105 as obtained is transmitted to the control unit in the form of an electric signal. The control unit contains a computer, for example, and has an image processing function and a function of controlling the operation of the collet 61.

When the image pickup operation of the optical camera 64 is completed, the collet 61 is moved to a position above the electrode 123, as shown in FIG. 12B. Once the collet 61 reaches the position above the electrode 123, positions along horizontal two directions and a rotation angle in a horizontal plane are corrected. Namely, the control unit finely adjusts the movement of the collect 61 on the basis of the image of the indicator pattern 105 which is obtained by the optical camera 64, in order to correctly set the horizontal position of the laser diode element 101 on the lower stage surface and the direction in the horizontal plane. Consequently, the laser diode element 101 is positioned in the horizontal plane in accuracy within ± several μm.

Figure 13:
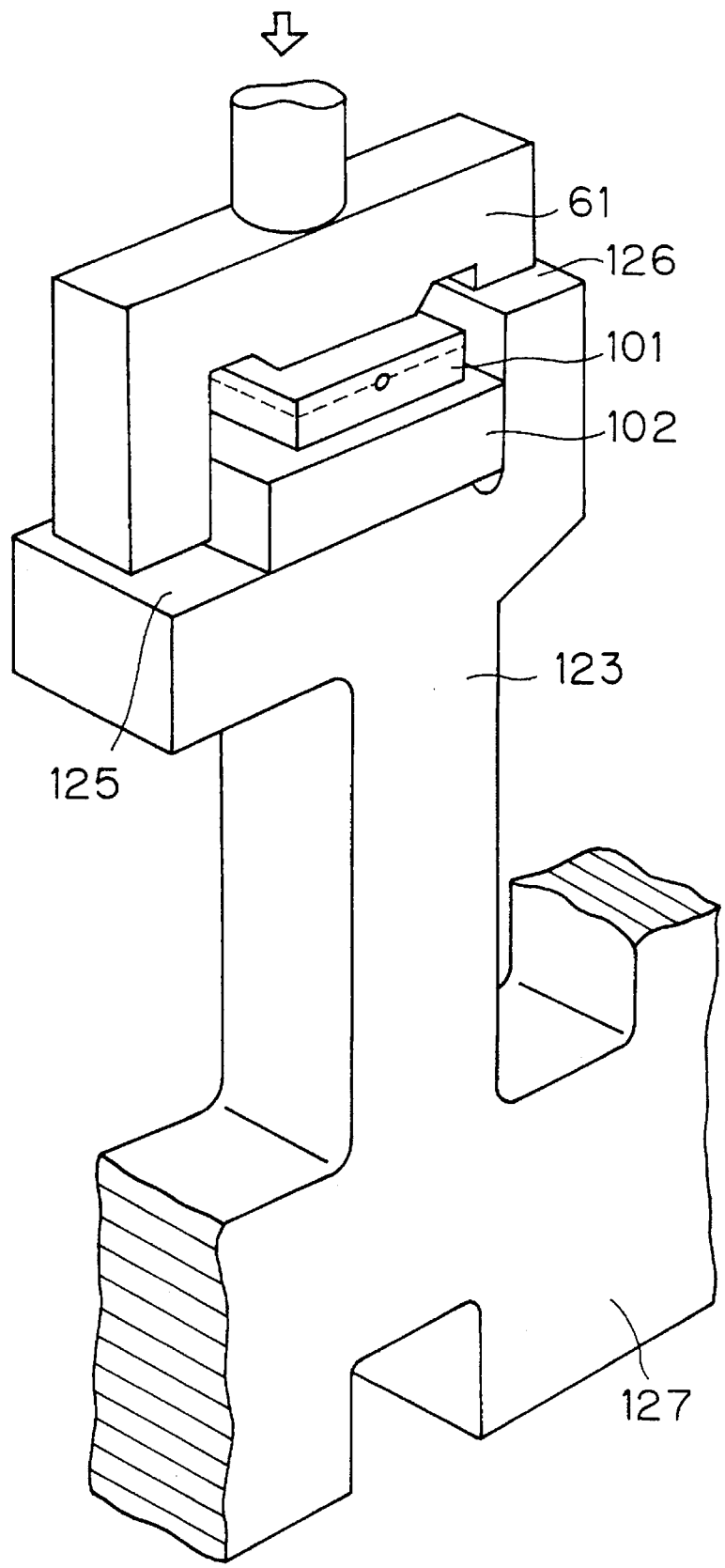
FIG. 13 illustrates a step of the fabrication method according to the first preferred embodiment of the present invention.
Figure 14:
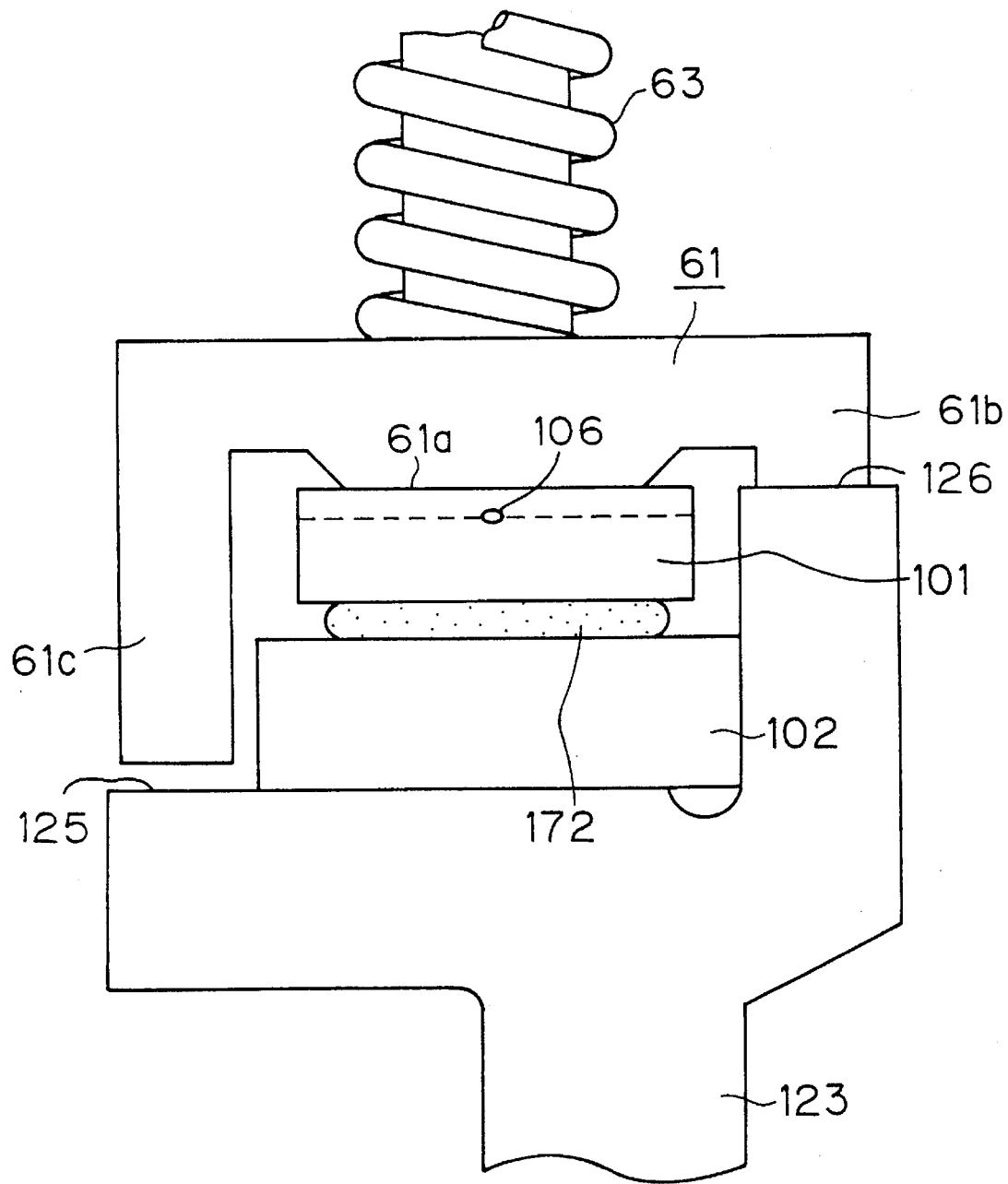
FIG. 14 illustrates a step of the fabrication method according to the first preferred embodiment of the present invention.

After completion of the positioning in the horizontal plane, the collet 61 is downwardly moved along the vertical direction as such, as shown in a perspective view of FIG. 13. Thus, the laser diode element 101 is mounted on the submount 102 through the solder 172. FIG. 14 is a front elevational view showing positional relations between the respective parts upon complete downward movement of the collet 61.

As shown in FIG. 14, the collet 61 is downwardly moved until the bottom surface of the leg portion 61b comes into contact with the upper stage surface 126 serving as a reference surface. The other leg portion 61c of the collet 61 is set in such a length that the same is not in contact with the lower stage surface 125 when the leg portion 61b is in contact with the upper stage surface 126. The collet 61 is flexibly supported along the vertical direction as described above, whereby the leg portion 61b flexibly comes into contact with the upper stage surface 126.

Consequently, the position of the laser diode element 101 along the vertical direction, i.e., along the direction y, is decided with reference to the upper stage surface 126. The upper stage surface 126 is precisely worked in accuracy of ±2 μm as described above, whereby the laser diode element 101 is vertically positioned in accuracy of ±2 μm. Further, the collet 61 suctionally holds the upper surface, which is closest to the opening portion 106 in the two surfaces other than those exposing the junction part, as described above. In the step of preparing the laser diode element 101, the space between the upper surface which is in contact with the collet 61 and the opening portion 106 is decided in high accuracy within about ±3 μm. Therefore, the position of the opening part 106 defining the optical axis 110 along the vertical direction is decided in accuracy within about ±5 μm.

The solder 172 is previously applied with a certain degree of thickness, so that the same is pressed by the laser diode element 101 and the submount 102 from above and below with proper pressures when the leg portion 61b comes into contact with the upper stage surface 126. Thus, soldering is reliably executed by the solder 172.

Upon completion of the vertical positioning, the laser diode element 101 is temporarily heated to a temperature exceeding the melting point of the solder 172 and thereafter cooled, to be soldered to the submount 102. The heating is carried out in a range not exceeding the melting point of the solder 171. Thus, there is no such possibility that the solder 171 is melted in the heating process to release the fixed state between the submount 102 and the electrode 123.

According to this method, as hereinabove described, the laser diode element 101 is positioned along the direction y with reference to the precisely worked upper stage surface 126 which is provided in proximity to the mounting position for the laser diode element 101, whereby the positioning is carried out in high positional accuracy. Further, the upper stage surface 126 which is higher than the lower stage surface 125 for fixing the laser diode element 101 and the submount 102 serves as the reference surface, whereby the reference surface is not contaminated with the solder 171 and the solder 172 flowing out in the heating process. Thus, the positioning accuracy for the laser diode element 101 is not deteriorated due to contamination with the solder 171 and the solder 172.

As hereinabove described, further, the leg portion 61c is separated from the lower stage surface 125 with a proper distance when the leg portion 61b comes into contact with the upper stage surface 126. This guarantees that the collet 61 regularly comes into contact with the electrode 123 between the leg portion 61b and the upper stage surface 126 even if the lower stage surface 125 is contaminated with the solder 171 and the solder 172.

When the laser diode element 101 is completely fixed to the submount 102 by soldering, the collet 61 stops the sucking operation, releases the laser diode element 101 and thereafter returns to its initial position. Thus, the laser diode element 101 is completely mounted on the submount 102. Namely, the laser diode element 101 is fixedly supported on the lower stage surface 125 through the submount 102.

<1-2-3. Step of Mounting Photodiode>

Before completion of the step S10, steps S4 and S5 and a step S11 which is subsequent thereto are carried out (FIG. 3). At the step S4, the photodiode 111 is prepared. At the step S5, on the other hand, the submount 112 for the photodiode 111 is prepared. These steps are well known in the art, and hence redundant description is omitted.

Then, the process advances to the step S11, so that the photodiode 111 is mounted on the submount 112. This mounting step is carried out by soldering with Au—Sn solder having a melting point of 180° C., or Au—Si solder having a melting point of 376° C., for example.

Figure 15:
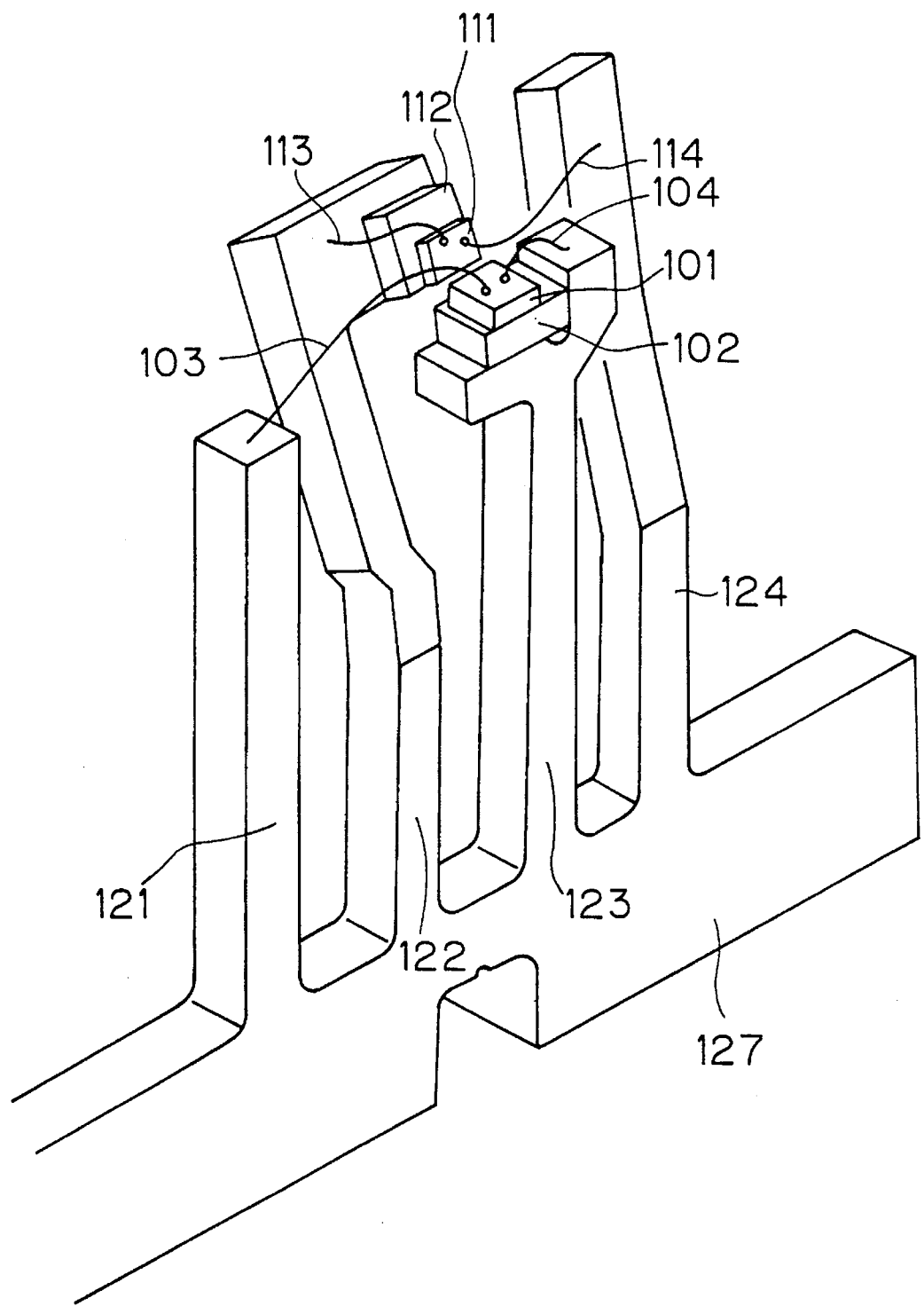
FIG. 15 illustrates a step of the fabrication method according to the first preferred embodiment of the present invention.

After both of the steps S10 and S11 are completed, the process advances to a step S12. At this step, the submount 112 which is integrated with the photodiode 111 is mounted on the electrode 122, as shown in a perspective view of FIG. 15. The process further advances to a step S13, so that the wires 103, 104, 113 and 114 are mounted. These wires are mounted by a well-known wire bonder. FIG. 15 shows positional relations between the respective parts upon completion of the step S14. The electrodes 122 and 124 are bent at the same angle, whereby the wire 114 can be readily mounted.

As shown in FIG. 15, the submount 112 which is integrated with the photodiode 111 is fixed to a side surface of the forward end portion of the electrode 122 which is opposite to the laser diode element 101 by soldering. At this time, selected is a solder material having a melting point which is lower than those of the theretofore employed solder materials, such as an Au—Sn solder material having a melting point of 216° C., for example. Thus, it is possible to solder the submount 112 while melting none of the theretofore employed solder materials. The upper surface of the forward end portion of the electrode 122, or the side surface fixing the submount 112, for example, may be selected as a reference surface for mounting the photodiode 111.

The wires 103, 104, 113 and 114 are mounted to extend across the laser diode element 101 and the electrode 121, across the laser diode element 101 and the electrode 124, across the photodiode 111 and the electrode 122, and across the photodiode 111 and the electrode 124. respectively.

<1-2-4. Molding Step>

Before completion of the step S13, steps S7 and S8 are carried out (FIG. 3). At the step S7, a mold for molding the laser diode unit 100 is prepared. At the step S8, on the other hand, transparent resin for the molding is prepared.

Figure 16:
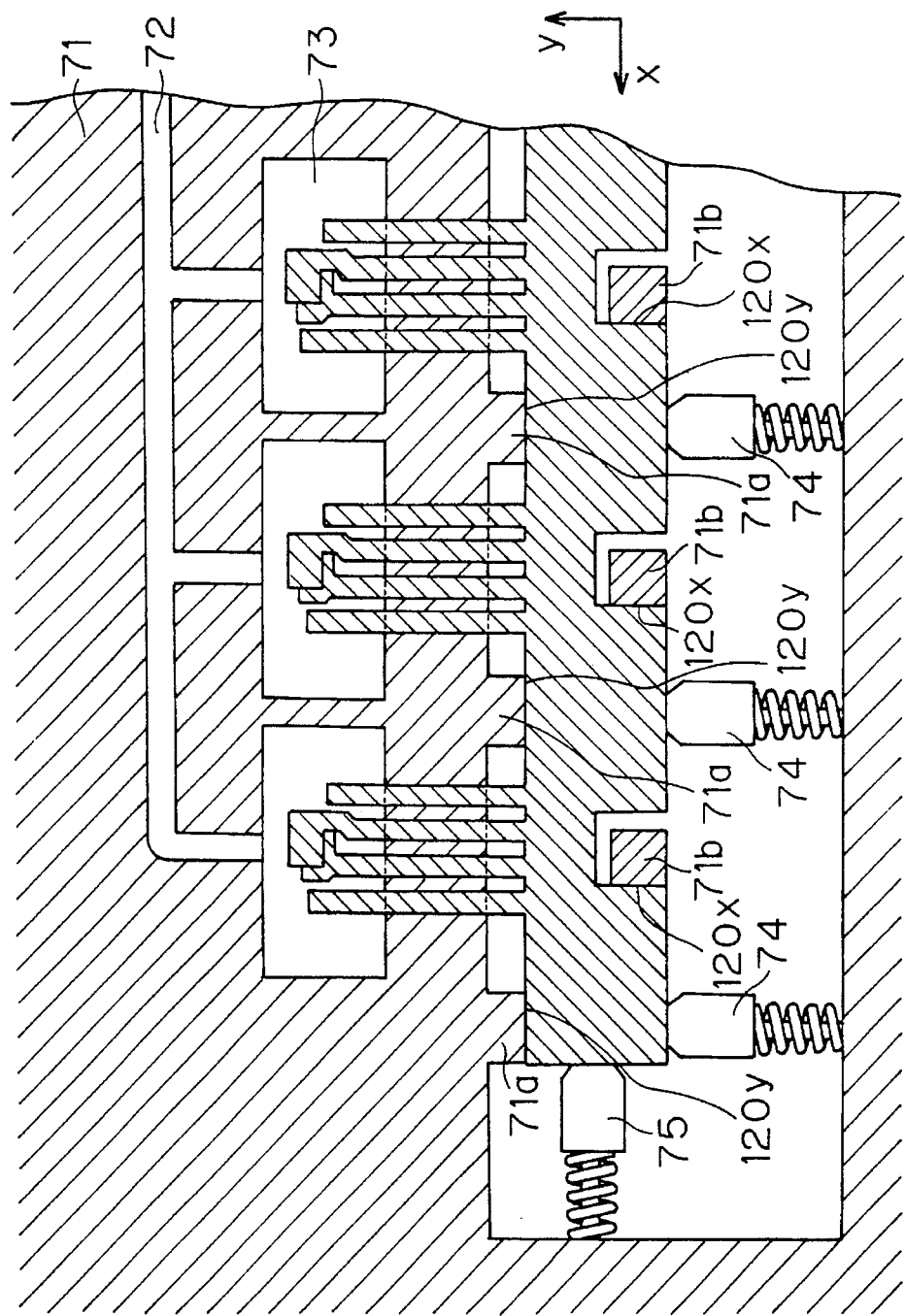
FIG. 16 illustrates a step of the fabrication method according to the first preferred embodiment of the present invention.

After completion of the steps S13, S7 and S8, the process advances to a step S14. At the step S14, a molding step is carried out with the mold which is prepared in the step S7 and the resin which is prepared in the step S8. FIG. 16 is a plan view showing lead frames 120, provided with laser diode elements 101 etc., which are mounted on a lower mold section 71 for carrying out this step.

The mold is formed by the lower mold section 71 and a switchable upper mold section (not shown) which is opposed to its upper surface, so that the lead frames 120 are placed on prescribed positions of the upper surface of the lower mold section 71 while the upper mold section is opened. The lower mold section 71 is provided on its upper surface with cavities 73 for sealing molding resin in prescribed shapes, and an injection path 72 for pressure-feeding the molding resin into the cavities 73. The upper mold section is also provided on its lower surface with cavities and an injection path (not shown).

The lower mold section 71 is further provided with projections 71a and 71b which are integrally formed with the same. Further, the lower mold section 71 is provided with pressing members 74 and 75 projecting toward the lead frames 120 which are placed thereon. The pressing members 74 and 75 are supported on the lower mold section 71 through springs.

The pressing members 74 and 75 are coupled with a releasing mechanism (not shown). When the lead frames 120 are placed on the lower mold section 71, this releasing mechanism operates to retract the pressing members 74 to 75 not to interfere with the lead frames 120. When the lead frames 120 are placed, the pressing members 74 and 75 press the end surfaces of the lead frames 120 along the directions y and x respectively, due to actions of the springs following the same.

Figure 17:
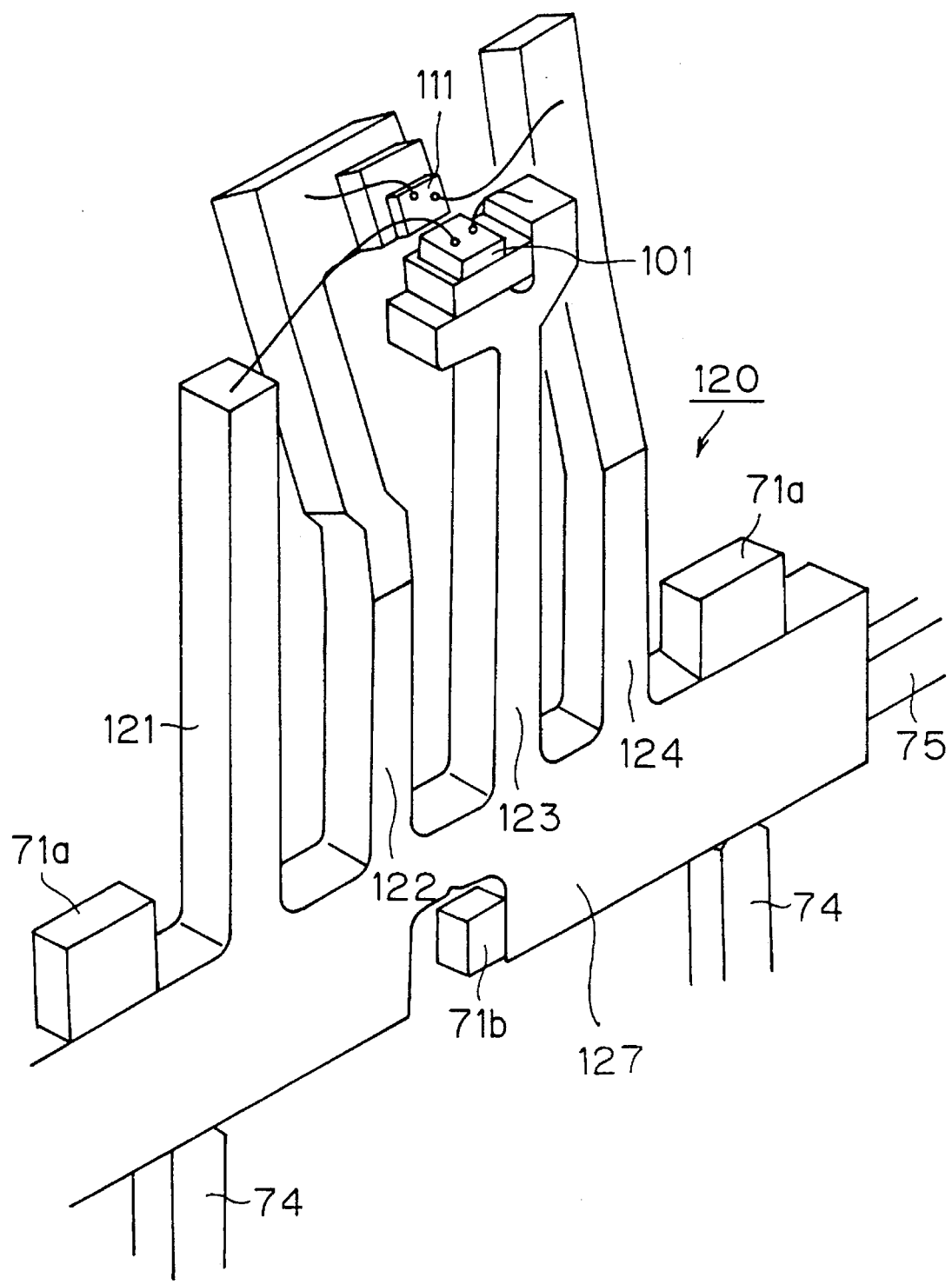
FIG. 17 illustrates a step of the fabrication method according to the first preferred embodiment of the present invention.

Consequently, the projections 71a and 71b partially forming the lower mold section 71 come into contact with the reference surfaces 120y and 120x of the lead frames 120 respectively with pressing force. FIG. 17 is a perspective view showing the positional relations between the respective parts. Each lead frame 120 is located on a prescribed position of the lower mold section 71 with reference to the reference surfaces 120y and 120 x.

Figure 18:
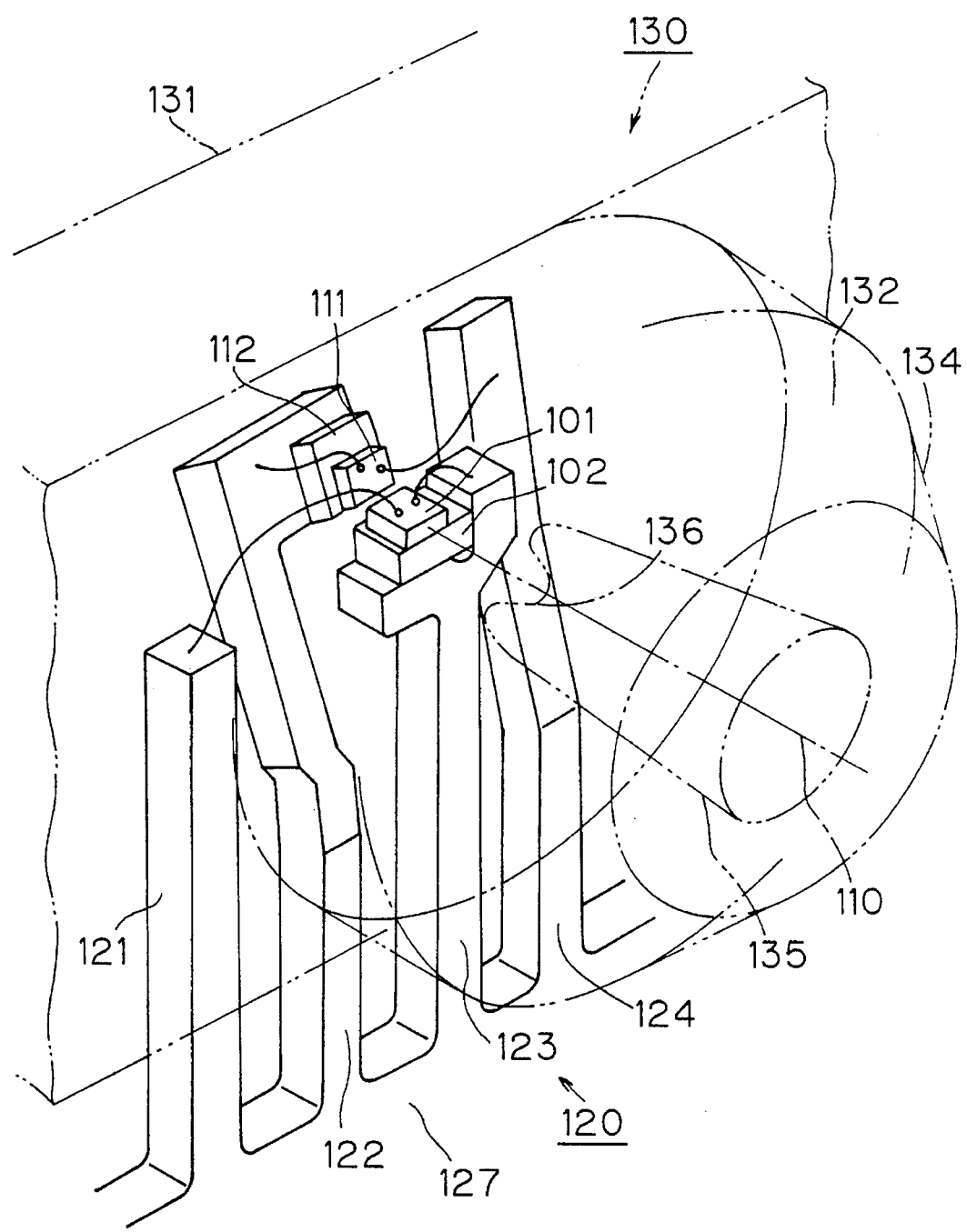
FIG. 18 illustrates a step of the fabrication method according to the first preferred embodiment of the present invention.

When each lead frame 120 is located on the prescribed position, the molding resin is pressure-fed into each cavity 73 through the injection path 72 while the upper mold section is closed. Thereafter the molding resin is heated at a proper temperature, to be cured. Thus, the molding is completed. FIG. 18 is a perspective view showing the lead frame 120 etc. upon completion of the molding.

Due to the molding, the laser diode element 101 and the like are sealed in the form of the resin molding 130 shown in FIG. 18. Upon completion of the molding, the upper mold section is opened and the pressing members 74 and 75 are released, so that the lead frame 120 which is sealed with the resin molding 130 is taken out from the lower mold section 71.

In this molding step, as hereinabove described, the position of the lead frame 120 with respect to the lower mold section 71 is accurately decided with reference to the precisely worked reference surfaces 120y and 120x. Thus, the resin molding 130 is positioned in high accuracy within ±10 µm with respect to the optical axis 110.

Thereafter the process advances to a step S15 (FIG. 3), so that the four electrodes 121, 122, 123 and 124 are cut off from the lead frame body 127 of the lead frame 120 shown in FIG. 18, to be separated from each other. Consequently, the laser diode unit 100 shown in FIG. 2 is completed.

<1-3. Structure of Receptacle>

Figure 19:
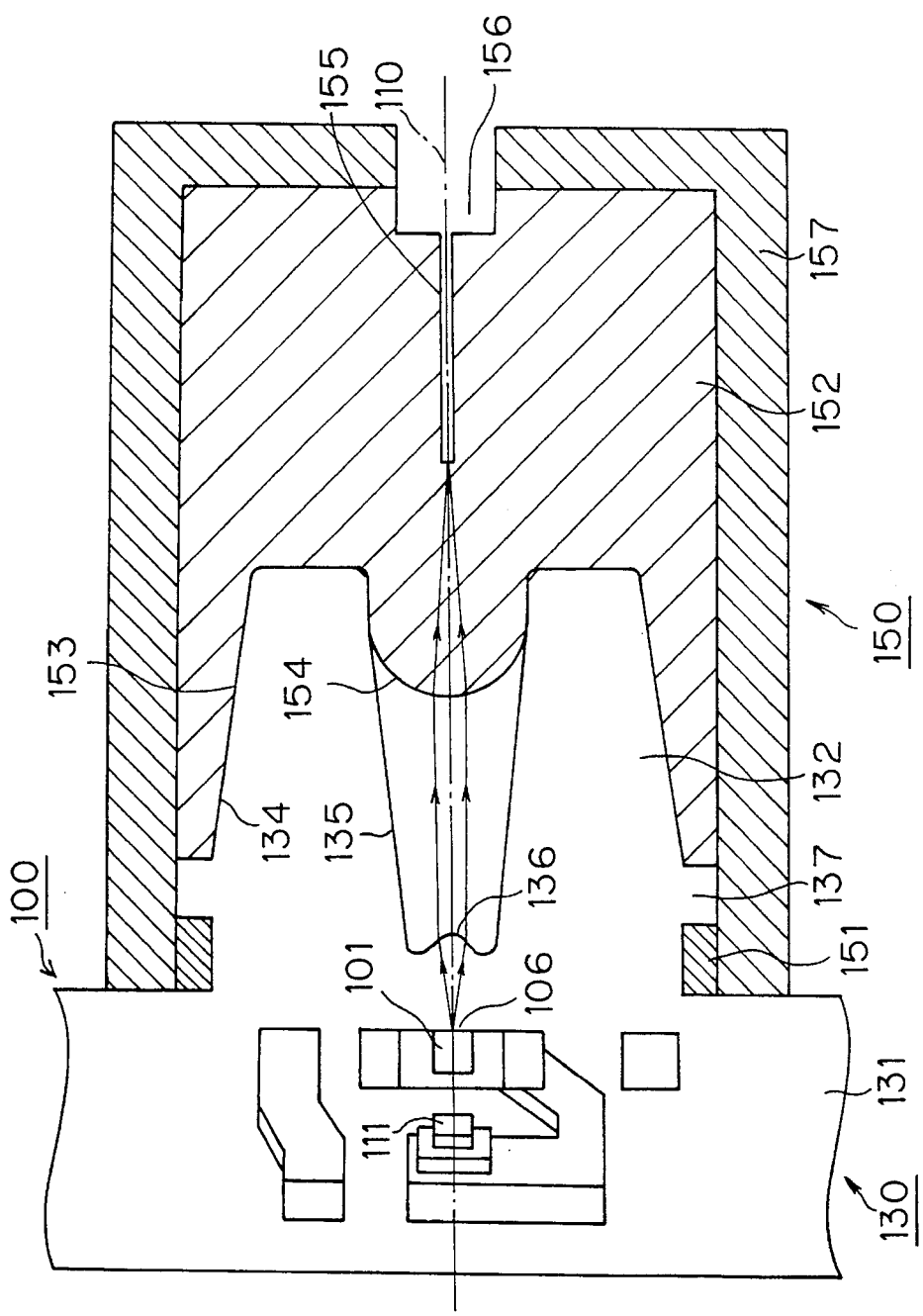
FIG. 19 is a plan sectional view showing the optical transmission module according to the first preferred embodiment of the present invention.

Then, the structure of the receptacle 150 is further described. FIG. 19 is a plan sectional view showing the receptacle 150 which is coupled to the laser diode unit 100. A body portion 152 which is a principal part of the receptacle 150 to be engaged with the projection 132 is made of transparent resin. The body portion 152 has a rotation-symmetrical shape. A tapered depression 153 is formed in an end of the body portion 152 which is engaged with the projection 132. Further, a projecting lens 154 is formed on the bottom of the depression 153. On the other hand, a thin deep hole 155 for receiving an optical fiber member and a thick shallow hole 156 for receiving a cable are formed in the other end of the receptacle 150 along a rotation symmetry axis.

The tapered side surface 134 is engaged with the tapered depression 153 while the lens 154 is engaged with the tapered depression 135, thereby coupling the projection 132 with the body portion 154. Thus, the positional relation between the rotation symmetry axis of the body portion 152 and the optical axis 110 in the laser diode unit 100 is univocally decided. Further, the body portion 152 is molded through a precisely worked mold, and further subjected to additional precise working after the molding at need.

Therefore, the optical axis 110 is aligned with the rotation symmetry axis of the body part 152 in accuracy within about ±10 µm. Consequently, the laser beam which is emitted from the opening portion 106 of the laser diode element 101 is condensed by the lens 136 and further condensed by the lens 154, to be correctly incident upon the optical fiber member which is inserted in the hole 155 provided in the body portion 152.

The outer surface of the body portion 152 is covered with a protective case 157. Further, the stop member 151 is mounted on the inner periphery of the opening portion of the case 157. As hereinabove described, the stop member 151 is engaged with the flange-shaped projection 137, to prevent unprepared releasing of the coupling between the receptacle 150 and the laser diode unit 100.

<2. Second Preferred Embodiment>

Figure 20:
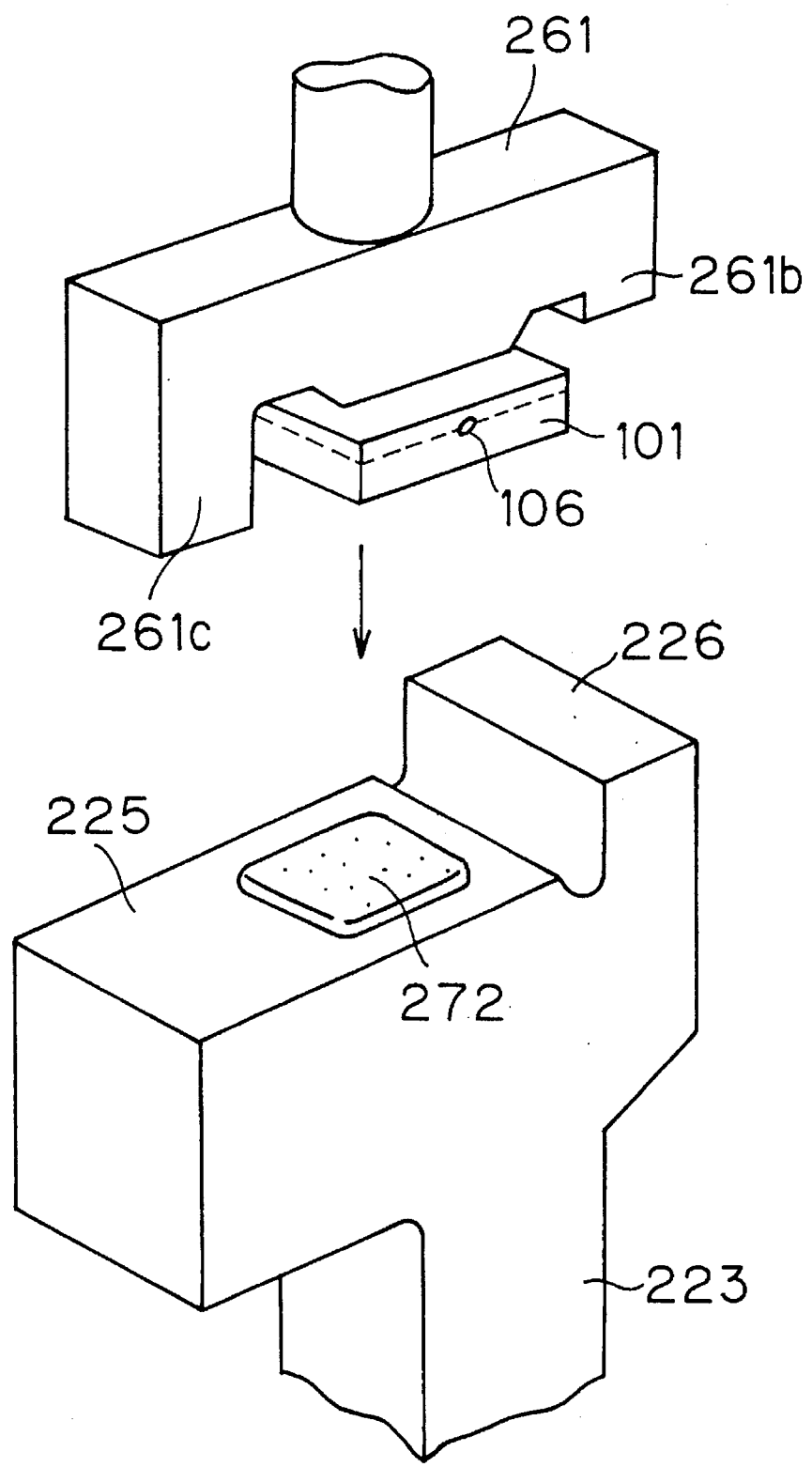
FIG. 20 illustrates a step of a fabrication method according to a second preferred embodiment of the present invention.

Description is now made on a second preferred embodiment of the present invention in relation to the structure of a laser diode unit and a method of fabricating the same. FIG. 20 is a perspective view showing a step of mounting a laser diode element 101 on an electrode 223 in the method according to this preferred embodiment, in correspondence to FIG. 12B showing the first preferred embodiment. Referring to FIG. 20, the laser diode element 101 is mounted on the electrode 223, which is a part corresponding to the electrode 123 in the unit according to the first preferred embodiment.

As shown in FIG. 20, the method according to this preferred embodiment is characteristically different from that of the first preferred embodiment in a point that the laser diode element 101 is directly fixed to an upper surface of a forward end of the electrode 223 with no employment of the submount 102. In the method according to this preferred embodiment, therefore, both of the steps S2 and S3 are omitted in the flow chart shown in FIG. 3.

In correspondence to this, a step between lower and upper stage surfaces 225 and 226 of the electrode 223 are set to be smaller than that in the electrode 123. In a collet 261 which is employed for placing the laser diode element 101 on the lower stage surface 225, further, difference between lengths of leg portions 261b and 261c is set to be smaller than that in the collet 61 which is employed in the first preferred embodiment.

In order to fix the laser diode element 101 onto the lower stage surface 225, solder 272 is previously applied to the lower stage surface 225. Thereafter the collet 261 holding the laser diode element 101 which is completely positioned in a horizontal plane similarly to that in the first preferred embodiment is downwardly moved to mount the laser diode element 101 on the lower stage surface 225 through the solder 272.

Similarly to the first preferred embodiment, the lower surface of the leg portion 261*b* comes into contact with the upper stage surface 226 which is precisely worked, thereby vertically positioning the laser diode element 101. Namely, the upper stage surface 226 serves as a reference surface.

Thereafter heating and cooling are carried out to completely solder the laser diode element 101 to the lower stage surface 225 through the solder 272. The solder 272 can be prepared from the same solder material as the solder 171 or 172 employed in the first preferred embodiment, for example.

In the unit and the method according to this preferred embodiment, the fabrication steps are further simplified due to no employment of the submount 102, whereby the fabrication cost is further reduced.

<3. Third Preferred Embodiment>

Figure 21:
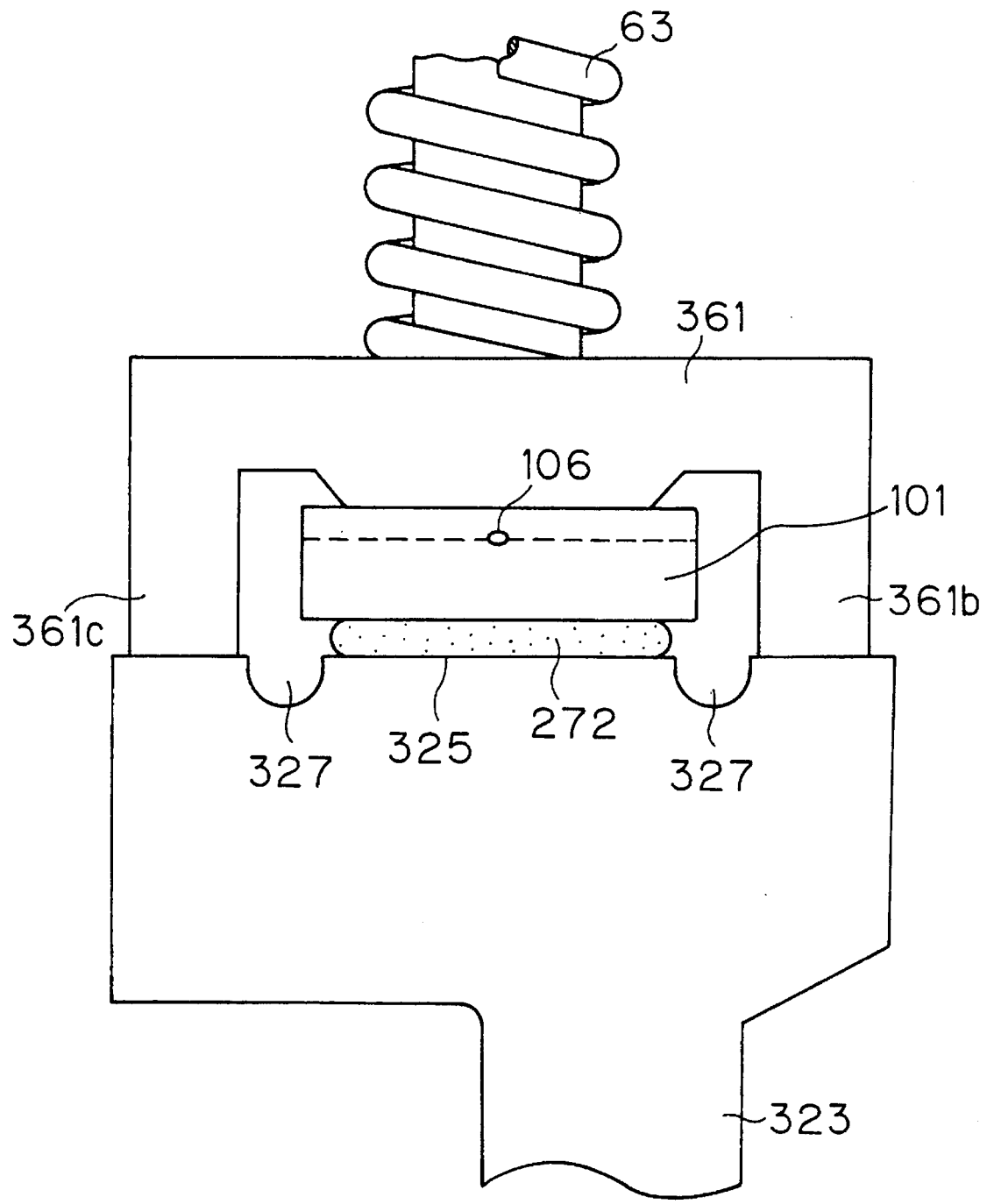
FIG. 21 illustrates a step of a fabrication method according to a third preferred embodiment of the present invention.

Description is now made on a third preferred embodiment in relation to the structure of a laser diode unit and a method of fabricating the same. FIG. 21 is a front elevational view showing a step of mounting a laser diode element 101 on an electrode 323 in the method according to this preferred embodiment, in correspondence to FIG. 14 in the first preferred embodiment. Referring to FIG. 21, the laser diode element 101 is mounted on the electrode 323, which is a part corresponding to the electrode 123 in the unit according to the first preferred embodiment.

As shown in FIG. 21, no step is provided on an upper surface 325 of a forward end portion of the electrode 323. On the other hand, grooves 327 are formed between the central portion and both end portions of the flat upper surface 325. Solder 272 is previously applied onto the central portion of the upper surface 325 which is held between the two grooves 327.

In a collet 361 for suctionally holding the laser diode element 101, two leg portions 361*b* and 361*c* are set at the same lengths in correspondence to provision of no step on the forward end portion of the electrode 323. The collet 361 holding the laser diode element 101 is completely positioned in a horizontal plane similarly to that of the first preferred embodiment and thereafter downwardly moved, so that the laser diode element 101 is mounted on the upper surface 325 through the solder 272, as shown in FIG. 21. Thereafter heating and cooling are carried out to complete soldering of the laser diode element 101 to the upper surface 325 through the solder 272.

The upper surface 325 is precisely worked, similarly to the upper stage surface 226 in the first preferred embodiment etc. The lower surface of the leg portion 361*b* comes into contact with both end portions of the upper surface 325 corresponding to outer sides of the two grooves 327, thereby dividing the vertical position of the laser diode element 101. Namely, the central portion of the upper surface 325 which is held between the two grooves 327 serves as an element mounting surface, while the both end portions serve as reference surfaces.

Thus, no step is provided on the forward end portion of the electrode 323 in the unit and the method according to this preferred embodiment, whereby it is possible to readily work a lead frame and to reduce the cost for the working in response thereto. Due to the grooves 327 which are formed between the element mounting surface and the reference surfaces on the upper surface 325, further, there is no such possibility that the solder 272 flows out to cause errors on the reference surfaces.

In the collet 361, one of the leg portions 361*b* and 361*c* may alternatively be properly increased in length so that only this one comes to contact with the upper surface 325. In this case, only a single groove 327 is sufficient. Thus, the steps of working the lead frame are further simplified.

<4. Fourth Preferred Embodiment>

Description is now made on a fourth preferred embodiment of the present invention in relation to an optical semiconductor device and a method of fabricating the same. The optical semiconductor device herein described is a laser receiving unit. FIG. 22 is a perspective view showing a step in the method of fabricating the laser receiving unit, in correspondence to FIG. 15 in the first preferred embodiment. The method according to this preferred embodiment requires no laser diode element 101, whereby all steps related to the laser diode element 101 are omitted in the flow chart shown in FIG. 3. Namely, the steps S2, S3, S9 and S10 are omitted.

As shown in FIG. 22, a lead frame 120 which is identical to that employed in the first preferred embodiment is used also in this unit. Among four electrodes, only electrodes 122 and 124 are used while electrodes 121 and 123 are not used. Further, the lead frame 120 is not bent. In order to mount a photodiode 111 which is an optical semiconductor element on the electrode 122, the photodiode 111 is integrally fixed to a submount 112 so that the submount 112 which is integrated with the photodiode 111 is fixed to a side surface of a forward end portion of the electrode 123, similarly to the first preferred embodiment.

For example, an upper surface of the forward end portion of the electrode 122, or the same surface as that for fixing the submount 112 may be selected as a reference surface for mounting the photodiode 111. In the laser receiving unit, however, no strict positional accuracy is required for an optical axis dissimilarly to the laser diode unit 100 which is a light emitting unit. Therefore, it is not necessary to accurately decide the mounting position of the photodiode 111, dissimilarly to the mounting position of the laser diode element 101 in the laser diode unit 100.

Thereafter wires 113 and 114 are mounted. A following molding step is carried out similarly to that in the first preferred embodiment, whereby a resin molding 130 is made in the same shape as the resin molding 130 in the laser diode unit 100.

Figure 23:
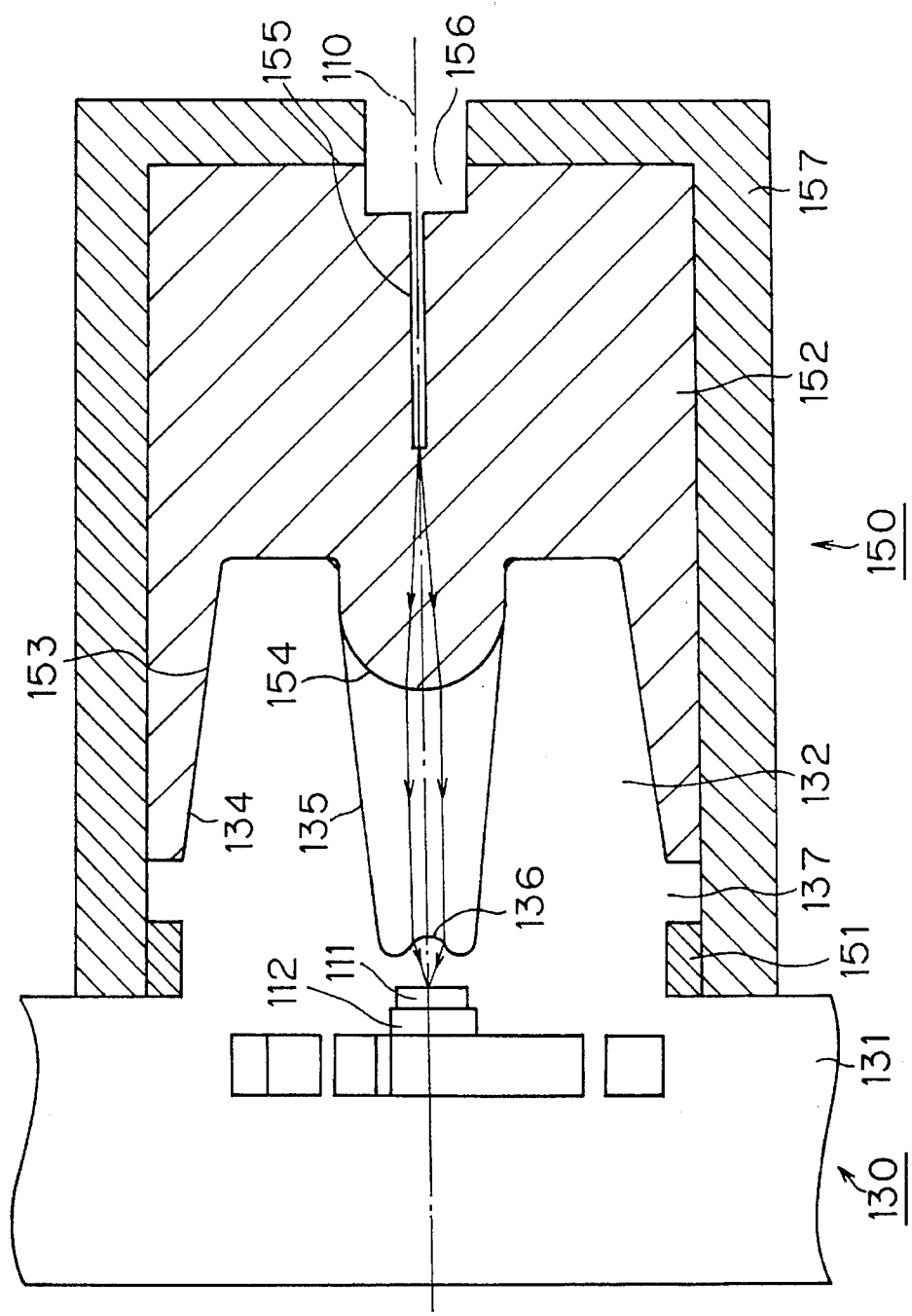
FIG. 23 is a plan sectional view showing an optical receiving module according to the fourth preferred embodiment of the present invention.

FIG. 23 is a plan sectional view showing an optical receiving module which is formed by coupling the laser receiving unit with a receptacle 150. The receptacle 150 is prepared from that having the same shape as the receptacle 150 in the optical transmission module 40 according to the first preferred embodiment to be engaged with the resin molding 130 of the laser receiving unit, thereby implementing coupling between the laser receiving unit and the receptacle 150.

Therefore, it is possible to accurately align an optical axis 110 of the laser receiving unit with a rotation symmetry axis of a body portion 152 of the receptacle 150. Thus, a laser beam emitted from an optical fiber member which is inserted in a hole 155 provided in the body portion 152 is condensed by a lens 154 and further condensed by a lens 136, to be correctly incident upon a light receiving part of the photodiode 111.

Further, the laser receiving unit is fixed to a support member (not shown), similarly to the optical transmission module 40 shown in FIG. 1. When the receptacle 150 is attached to and detached from the laser receiving unit, therefore, no useless force acts on the electrodes of the laser receiving unit, to neither break nor deform the electrodes.

The lead frame 120 may be replaced by a separately prepared lead frame from which unused electrodes 121 and 123 are removed. However, the receiving unit and the laser diode unit 100 are generally employed in a paired manner, and hence the method of this preferred embodiment applying the lead frame 120 which is employed in the laser diode unit 100 to the receiving unit as such can be regarded more economical.

While the invention has been shown and described in detail, the foregoing description is in all aspects illustrative and not restrictive. It is therefore understood that numerous modifications and variations can be devised without departing from the scope of the invention.

What is claimed is:

1. An optical semiconductor device comprising:
   (a) an optical semiconductor unit, including:
      (a-1) an optical semiconductor element,
      (a-2) a single-piece light transmittable sealing body, sealing said optical semiconductor element, having a tapered projection, and
      (a-3) an electrode having an end being electrically connected to said optical semiconductor element and another end projecting from said sealing body;
   (b) a receptacle being capable of mounting an optical fiber cable and attachable to and detachable from said tapered projection of said optical semiconductor unit, for relaying optical coupling between said optical semiconductor unit and said optical fiber cable.

2. The optical semiconductor device in accordance with claim 1, wherein
   said optical semiconductor element has a laser diode.

3. The optical semiconductor device in accordance with claim 2, wherein
   said semiconductor element further includes a photodiode for monitoring light intensity of said laser diode.

4. The optical semiconductor device in accordance with claim 3, wherein
   said laser diode is capable of bidirectionally emitting a laser beam in frontward and rearward directions,
   said receptacle transmitting said frontwardly emitted laser beam,
   said photodiode receiving said rearwardly emitted laser beam.

5. The optical semiconductor device in accordance with claim 4, wherein
   said electrode comprises:
      (a-3-1) first and second columnar unit electrodes being arranged substantially in parallel with each other and provided with upper ends being electrically connected to said optical semiconductor element and lower ends projecting from said sealing body,
   a top portion of said upper end of said first unit electrode being provided with a flat element mounting surface,
   said laser diode being fixedly mounted on said element mounting surface,
   said photodiode being fixedly mounted on an upper end side surface of said second unit electrode,
   said upper end side surface being inclined with respect to that of said first unit element so that said rearwardly emitted laser beam can be obliquely incident upon said photodiode.

6. The optical semiconductor device in accordance with claim 5, wherein
   said electrode further comprises:
      (a-3-2) third and fourth columnar unit electrodes being arranged substantially in parallel with said first and second unit electrodes and provided with upper ends being electrically with said optical semiconductor element and lower ends projecting from said sealing body,
   first and second electrodes of said laser diode being electrically connected to said upper end portions of said first and third unit electrodes through wires respectively,
   first and second electrodes of said photodiode being electrically connected to said upper end portions of said second and fourth unit electrodes through wires respectively.

7. The optical semiconductor device in accordance with claim 6, wherein
   said lower ends of said first to fourth unit electrodes projecting from said sealing body are arranged in parallel with each other.

8. The optical semiconductor device in accordance with claim 5, wherein
   a heat conductive submount having a thermal expansion coefficient being closer to that of said laser diode in comparison with said electrode is fixedly interposed between said laser diode and said element mounting surface.

9. The optical semiconductor device in accordance with claim 8, wherein
   said submount is regarded as a first submount, a heat conductive second submount having a thermal expansion coefficient being closer to that of said photodiode in comparison with said electrode being fixedly interposed between said photodiode and said upper end side surface of said second unit electrode.

10. The optical semiconductor device in accordance with claim 5, wherein
    a flat reference surface being identical or parallel to said element mounting surface is further provided on said top portion of said upper end of said first unit electrode.

11. The optical semiconductor device in accordance with claim 10, wherein
    a step is provided between said element mounting surface and said reference surface so that said reference surface defines an upper stage surface.

12. The optical semiconductor device in accordance with claim 10, wherein
    said element mounting surface and said reference surface are formed as different regions on the same plane, with a groove being defined between said surfaces.

13. The optical semiconductor device in accordance with claim 1, wherein
    said sealing body substantially consists of light transmittable resin.

14. The optical semiconductor device in accordance with claim 1, wherein
    said sealing body has a conical first projection being rotation-symmetrical about an optical axis of said optical semiconductor element, said first projection being provided in the vicinity of said optical axis with a substantially conical first depression being rotation-symmetrical about said optical axis, said first depression being provided on its bottom portion with a lens capable of condensing a beam along said optical axis, and said receptacle is provided with a second depression being engageable with said first projection and rotation-symmetrical about said optical axis and a second projection being engageable with said first depression and rotation-symmetrical about said optical axis, said second projection forming a lens capable of condensing said beam along said optical axis.

15. The optical semiconductor device in accordance with claim 1, wherein said sealing body and said receptacle are provided with members forming a set of a projection and a stop member being engageable with said projection respectively, said sealing body and said receptacle being fixable to each other upon engagement of said projection and said stop member.

16. An optical semiconductor device comprising:
(a) an optical semiconductor unit, including:
  (a-1) an optical semiconductor element,
  (a-2) a single-piece light transmittable sealing body, sealing said optical semiconductor element, having a tapered projection, and
  (a-3) an electrode having an end being electrically connected to said optical semiconductor element and another end projecting from said sealing body;
(b) a receptacle being capable of mounting an optical fiber cable and attachable to and detachable from said tapered projection of said optical semiconductor unit, for relaying optical coupling between said optical semiconductor unit and said optical fiber cable;
(c) a socket being attachable to and detachable from said electrode; and
(d) a support being capable of fixedly supporting said optical semiconductor unit and fixedly coupled with said socket.

* * * * *